US010630241B2

(12) United States Patent
Ahmed et al.

(10) Patent No.: US 10,630,241 B2
(45) Date of Patent: Apr. 21, 2020

(54) AMPLIFIER WITH INTEGRATED DIRECTIONAL COUPLER

(71) Applicant: NXP USA, Inc., Austin, TX (US)

(72) Inventors: Abdulrhman M. S. Ahmed, Gilbert, AZ (US); Ebrahim M. Al Seragi, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/111,115

(22) Filed: Aug. 23, 2018

(65) Prior Publication Data

US 2020/0067459 A1    Feb. 27, 2020

(51) Int. Cl.
*H03F 3/68*  (2006.01)
*H03F 1/02*  (2006.01)
(Continued)

(52) U.S. Cl.
CPC ....... *H03F 1/0288* (2013.01); *H01L 21/4857* (2013.01); *H01L 23/49811* (2013.01); *H01L 23/49822* (2013.01); *H01L 23/49838* (2013.01); *H01L 23/66* (2013.01); *H01L 24/48* (2013.01); *H01L 24/85* (2013.01); *H01P 5/184* (2013.01); *H03F 1/565* (2013.01); *H03F 3/195* (2013.01); *H01L 2223/6611* (2013.01); *H01L 2223/6627* (2013.01); *H01L 2223/6655* (2013.01); *H01L 2224/48091* (2013.01); *H01L 2224/48106* (2013.01); *H01L 2224/48227* (2013.01);
(Continued)

(58) Field of Classification Search
CPC ................................. H03F 1/0288; H03F 3/68
USPC ............................................. 330/124 R, 295
See application file for complete search history.

(56) References Cited

U.S. PATENT DOCUMENTS 5,448,771 A    9/1995  Klomsdorf et al.
5,565,881 A    10/1996 Phillips et al.
(Continued)

FOREIGN PATENT DOCUMENTS

EP    2339745 A1    6/2011
KR    101057736 B1  8/2011
WO    2012043909 A1 4/2012

OTHER PUBLICATIONS

Shim, S. et al. "A CMOS Power Amplifier With Integrated-Passive-Device Spiral-Shaped Directional Coupler for Mobile UHF RFID Reader", IEEE Transactions on Microwave Theory and Techniques, vol. 59, No. 11, pp. 2888-2897 (Nov. 2011).

Primary Examiner — Steven J Mottola
(74) Attorney, Agent, or Firm — Sherry W. Schumm

(57) ABSTRACT

An embodiment of an amplifier includes a first amplifier with a first output terminal, a second amplifier with a second output terminal, and a plurality of microstrip transmission lines electrically connected to the amplifiers. The transmission lines include an impedance inverter line electrically connected between the first and second output terminals, and an output line electrically connected between the second output terminal and an output of the amplifier, where the output line forms a portion of an output impedance transformer. The amplifier also includes a directional coupler formed from a main line and a coupled line positioned in proximity to the main line, where the main line is formed from a portion of one of the transmission lines. The amplifier may also include a module substrate with a plurality of metal layers, where the main line and the coupled line are formed from different portions of the metal layers.

23 Claims, 7 Drawing Sheets

(51) Int. Cl.
  *H01P 5/18* (2006.01)
  *H01L 23/498* (2006.01)
  *H01L 21/48* (2006.01)
  *H01L 23/00* (2006.01)
  *H03F 3/195* (2006.01)
  *H03F 1/56* (2006.01)
  *H01L 23/66* (2006.01)

(52) U.S. Cl.
  CPC ............... *H01L 2924/1421* (2013.01); *H01L 2924/19032* (2013.01); *H01L 2924/30111* (2013.01); *H03F 2200/255* (2013.01); *H03F 2200/387* (2013.01); *H03F 2200/423* (2013.01); *H03F 2200/451* (2013.01)

(56) References Cited

U.S. PATENT DOCUMENTS

| | | | |
|---|---|---|---|
| 6,496,708 B1 | 12/2002 | Chan et al. | |
| 8,798,561 B2 * | 8/2014 | Acimovic | H03F 1/0294 330/295 |
| 9,007,142 B1 * | 4/2015 | Ozard | H03F 1/0288 330/124 R |
| 9,531,325 B2 | 12/2016 | Yu et al. | |
| 2008/0070519 A1 | 3/2008 | Okabe | |
| 2011/0001576 A1 | 1/2011 | Lee et al. | |
| 2011/0169590 A1 | 7/2011 | Namerikawa et al. | |
| 2012/0105170 A1 | 5/2012 | Noori et al. | |
| 2014/0132344 A1 * | 5/2014 | Outaleb | H01P 5/18 330/124 R |
| 2017/0250656 A1 * | 8/2017 | Musa | H01P 5/12 |
| 2017/0324392 A1 | 11/2017 | Srirattana et al. | |

\* cited by examiner

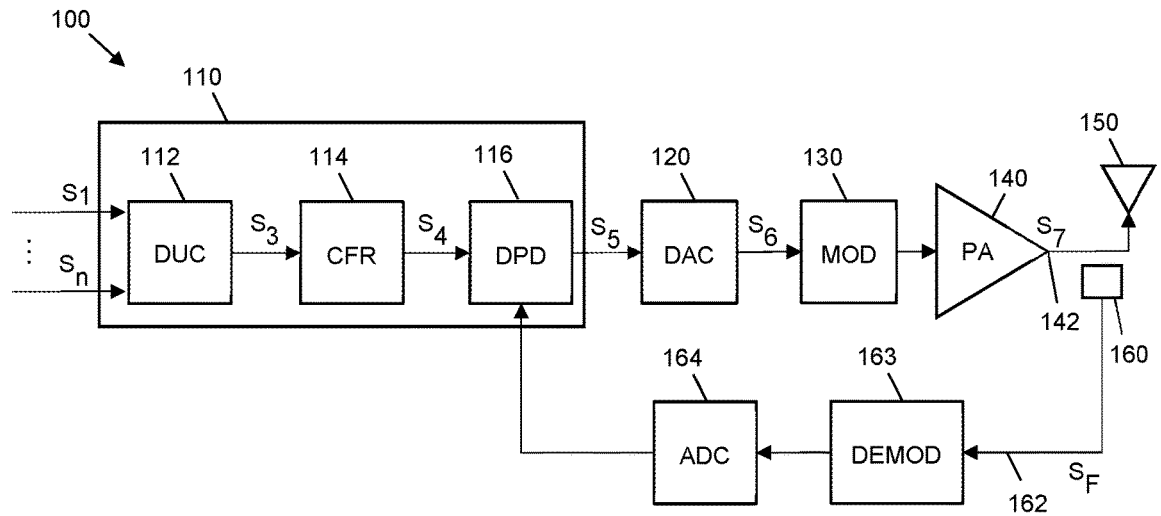
FIG. 1    -- PRIOR ART --
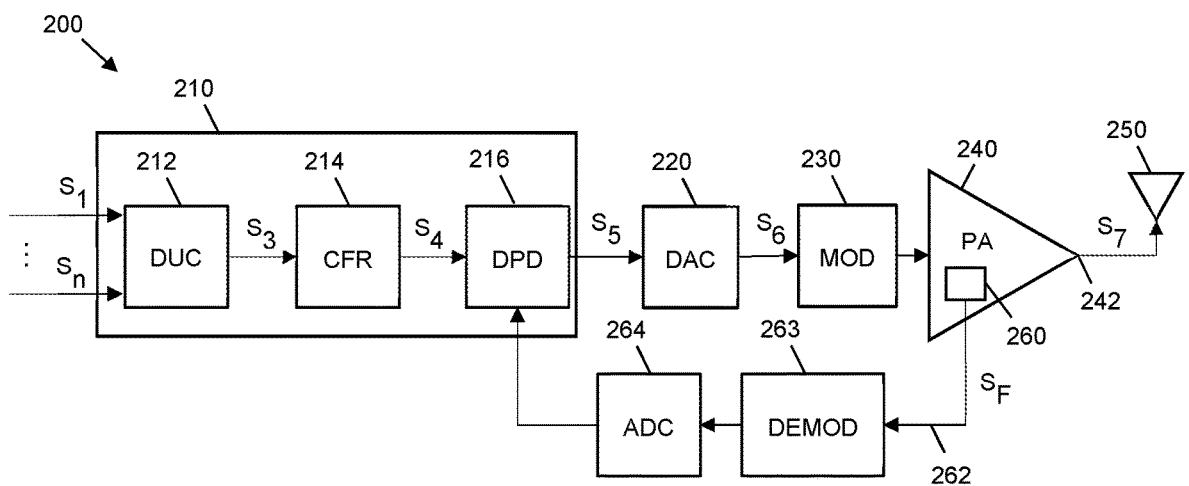
FIG. 2

US 10,630,241 B2

AMPLIFIER WITH INTEGRATED DIRECTIONAL COUPLER

TECHNICAL FIELD

Embodiments of the subject matter described herein relate generally to radio frequency (RF) communication systems, and more particularly to RF transmitters that utilize output signal feedback for digital pre-distortion of input RF signals.

BACKGROUND

In typical wireless communication system, a digital baseband processor produces an information-bearing signal that is processed by a transmitter lineup before radiation of an associated radio frequency (RF) signal over the air interface. For example, FIG. 1 is a simplified block diagram of part of a conventional transmitter lineup 100, which includes a digital front end (DFE) 110, a digital-to-analog converter (DAC) 120, a modulator (MOD) 130, a power amplifier (PA) 140, a demodulator (DEMOD) 163, an analog-to-digital converter (ADC) 164, and an antenna 150.

Generally, the DFE 110 processes digital baseband signals for various channels to pre-condition the digital signals for amplification and wireless transmission. In some systems, the DFE 110 may include several sequential processing blocks, such as a digital up-converter (DUC) block 112, a crest factor reduction (CFR) block 114, and a digital pre-distortion (DPD) block 116. The DUC block 112 receives signals S1 to Sn (e.g., n=2 to 5) from a baseband processor (not illustrated), where each of signals S1 to Sn corresponds to a unique digital, baseband, information-bearing signal that is intended to be conveyed using a distinct carrier signal. DUC block 112 up-converts the input signals, S1 to Sn, to a higher sampling rate, and produces a common digital composite signal, S3. The CFR block 114 performs peak-to-average power ratio reduction on the digital composite signal, S3, thereby creating a clipped digital composite signal, S4. The DPD block 116 then performs a digital pre-distortion process on the clipped digital composite signal, S4, so as to generate a digitally-predistorted baseband signal, S5. The digital pre-distortion performed by DPD block 116 is intended to pre-compensate for signal distortion that will be applied to an RF version of the signal by the downstream PA 140.

The pre-distorted digital baseband signal, S5, is converted to an analog baseband signal, S6, by DAC 120, and then upconverted by a modulator 130 to RF frequencies before being supplied to the PA 140. The PA 140 amplifies the analog RF signal, S6, resulting in a high-power RF signal, S7, which is produced at the output 142 of the PA 140. The high-power RF signal, S7, is then supplied to a system antenna 150, which radiates the signal over the air interface.

As indicated previously, the PA 140 may undesirably distort the RF signal during the amplification process, and the DPD block 116 is designed to pre-compensate for that distortion by pre-distorting the signal in the digital domain in an inverse manner. In order for the DPD block 116 to accurately pre-distort the digital signal, the DPD block 116 analyzes a feedback signal, SF, which is generated based on the amplified output signal, S7, that is traveling between the PA output 142 and the antenna 150. For example, a directional coupler 160 in proximity to a transmission line (e.g., a quarter-wave output transformer) between the PA output 142 and the antenna 150 may be used to generate the feedback signal, SF, which is a reduced-power (lower-amplitude) version of the amplified output signal, S7. The feedback signal, SF, is converted, along a feedback path 162, into a baseband signal by a demodulator 163, and the baseband feedback signal is then converted into a baseband digital signal by ADC 164 before being supplied to the DPD block 116.

In such a configuration, there may be an undesirably high level of insertion loss associated with both the quarter-wave output transformer and the directional coupler 160. As operational frequencies for wireless communication systems continue to increase, the detrimental impacts of these and other losses are becoming more acute. In order to achieve high efficiency, designers of wireless communication systems strive to reduce such losses in advanced transmitter and transceiver lineups.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 1 is a simplified block diagram of part of a conventional transmitter lineup;

FIG. 2 is a simplified block diagram of part of a transmitter lineup, in accordance with an example embodiment;

DETAILED DESCRIPTION

Figure 3:
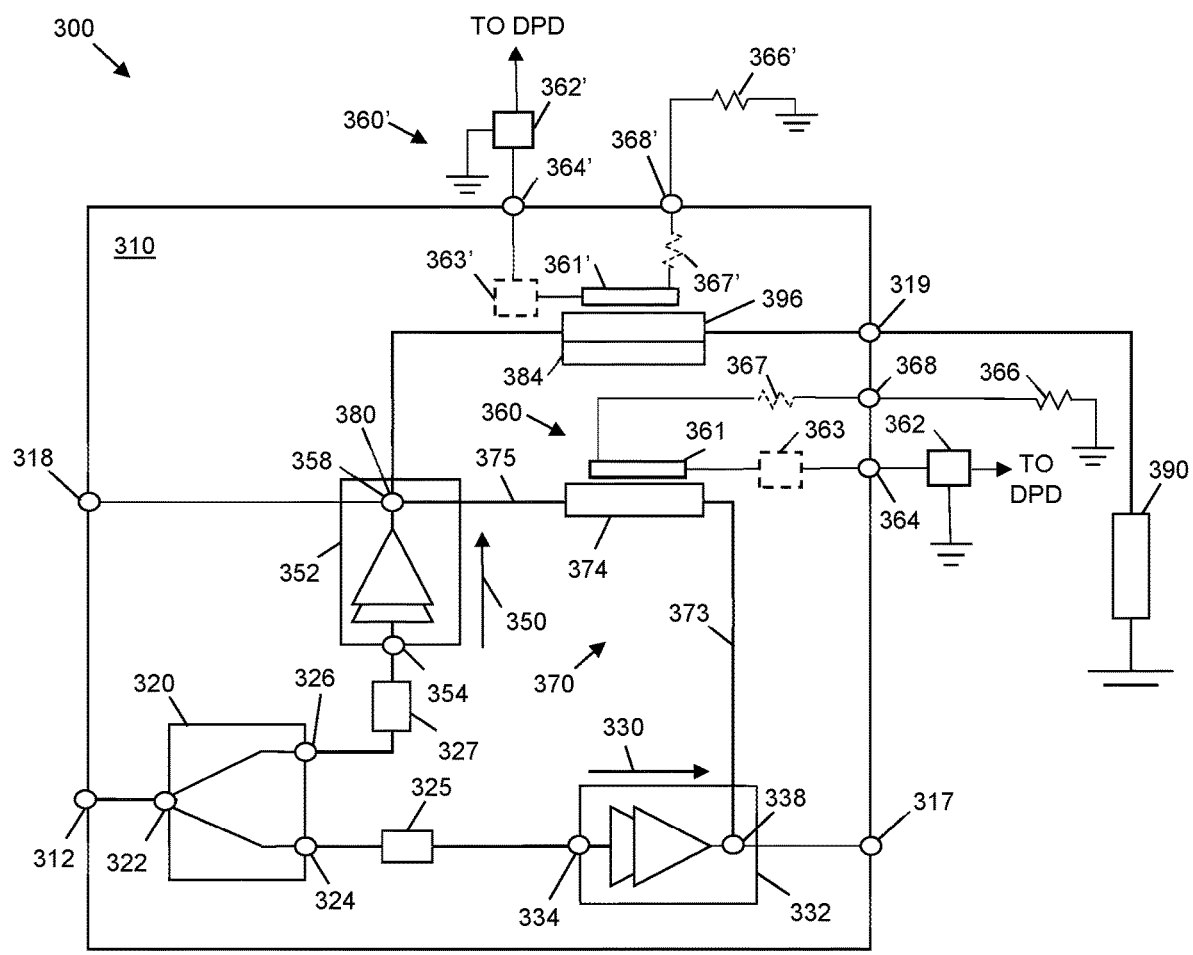
FIG. 3 is a schematic diagram of a Doherty amplifier, in accordance with an example embodiment.

Embodiments of the inventive subject matter include amplifiers and amplifier modules with integrated directional couplers. According to various embodiments, a directional coupler is integrally formed within a module in proximity to a signal transmission line within the amplifier, rather than in proximity to an external signal transmission line that is connected to the output of the amplifier. For example, in various embodiments, a coupled line of a directional coupler may be positioned in proximity to an impedance inverter line of a Doherty power amplifier, or in proximity to an output impedance transformer of a power amplifier.

FIG. 2 is a simplified block diagram of part of transmitter lineup 200, in accordance with an example embodiment. Transmitter lineup 200 includes a digital front end (DFE)

210, a digital-to-analog converter (DAC) 220, a modulator (MOD) 230, a power amplifier (PA) 240, a demodulator (DEMOD) 263, an analog-to-digital converter (ADC) 264, and an antenna 250. In addition, transmitter lineup 200 includes a directional coupler 260 that is internal to the PA 240, and a feedback path 262 between the directional coupler 260 and the DFE 210.

Generally, the DFE 210 processes digital baseband signals for various channels to pre-condition the digital signals for amplification and wireless transmission. According to an embodiment, the DFE 210 includes a digital up-converter (DUC) block 212, a crest factor reduction (CFR) block 214, and a digital pre-distortion (DPD) block 216. The DUC block 212 receives signals S1 to Sn (e.g., n=2 to 5) from a baseband processor (not illustrated), where each of signals S1 to Sn corresponds to a unique digital, baseband, information-bearing signal that is intended to be conveyed using a distinct carrier signal. For example, signals S1 to Sn may comprise time-domain, in-phase/quadrature (IQ) samples associated with a given communication technology. For example, signals S1 to Sn may correspond to LTE (Long Term Evolution) signals, respectfully associated with n LTE carriers, which are intended to be transmitted using the antenna 250 of an LTE base station. Although LTE may be one type of communication technology supported by the system, other communication technologies may be supported, as well.

DUC block 212 up-converts the input signals, S1 to Sn, to a higher sampling rate, and produces a common digital composite signal, S3. In conjunction with the up-conversion, DUC block 212 may perform channel filtering and cleaning operations on signals S1 to Sn in order to comply with spectral mask regulations (e.g., to avoid frequency leakage between the multiple carriers). Further, DUC block 212 may interpolate to a composite rate and may perform multi-carrier aggregation of the input signals, thereby creating the digital composite signal, S3, at a composite sampling rate.

The CFR block 214 performs peak-to-average power ratio reduction on the digital composite signal, S3, thereby creating a clipped digital composite signal, S4. The DPD block 216 then performs a digital pre-distortion process on the clipped digital composite signal, S4, so as to generate a digitally-predistorted signal, S5. The digital pre-distortion performed by DPD block 216 is intended to pre-compensate for signal distortion that will be applied to an RF version of the signal by the downstream PA 240.

The pre-distorted digital baseband signal, S5, is converted to an analog baseband signal, S6, by DAC 220, and then upconverted by a modulator 230 to RF frequencies before being supplied to the PA 240. The PA 240 amplifies the analog signal, S6, resulting in a high-power RF signal, S7, which is produced at the output 242 of the PA 240. The high-power RF signal, S7, is then supplied to a system antenna 250, which radiates the signal over the air interface.

As indicated previously, the PA 240 may undesirably distort the RF signal during the amplification process, and the DPD block 216 is designed to pre-compensate for that distortion by pre-distorting the signal in the digital domain in an inverse manner. In order for the DPD block 216 to accurately pre-distort the digital signal, the DPD block 216 analyzes a downconverted and digitized version of a feedback signal, SF. In contrast to conventional transmitter lineups, and in accordance with various embodiments of the inventive subject matter, the feedback signal, SF, is generated internally in the PA 250, rather than being generated based on the amplified output signal, S7, that is traveling between the PA output 242 and the antenna 250. For example, a directional coupler 260 in proximity to a transmission line within the PA 250 may be used to generate the feedback signal, SF, which is a reduced-power (lower-amplitude) version of the internal PA signal. The feedback signal, SF, is converted, along a feedback path 262, into a baseband signal by a demodulator 263, and the baseband feedback signal is then converted into a baseband digital signal by ADC 264 before being supplied to the DPD block 216.

Although PA 240 may have any of a number of power amplifier configurations, one particular type of amplifier configuration that is well-suited for modern wireless communication systems is the Doherty power amplifier. For example, FIG. 3 is a schematic diagram of a Doherty power amplifier 300 (e.g., PA 240, FIG. 2) that includes an integrated directional coupler 360 or 360' configured to generate a feedback signal (e.g., feedback signal, SF, FIG. 2) based on a forward signal traveling along a transmission line (e.g., transmission lines 374 or 396), in accordance with two example embodiments. As indicated in FIG. 3 with box 310, some or all components of Doherty amplifier 300 may be implemented in a single device package or module (e.g., a collection of components coupled to a single substrate).

Doherty amplifier 300 includes an RF input node 312, an RF output node 319, a power splitter 320, a carrier amplifier path 330, a peaking amplifier path 350, an impedance inverter line assembly 370, and a combining node 380, in an embodiment. When incorporated into a larger RF system, the RF input node 312 is coupled to an RF signal source (not illustrated, but such as DFE 210 or DAC 220, FIG. 2), and the RF output node 319 is coupled to a load 390 (e.g., antenna 250, FIG. 2, or another load). The RF signal source provides an input RF signal, which is an analog signal that includes spectral energy that typically is centered around one or more carrier frequencies. Fundamentally, the Doherty amplifier 300 is configured to amplify the input RF signal, and to produce an amplified RF signal at the RF output node 319.

The power splitter 320 has an input 322 and two outputs 324, 326, in an embodiment. The power splitter input 322 is coupled to the RF input node 312 to receive the input RF signal. The power splitter 320 is configured to divide the RF input signal received at input 322 into first and second RF signals (or carrier and peaking signals), which are provided to the carrier and peaking amplifier paths 330, 350 through outputs 324, 326. According to an embodiment, the power splitter 320 includes a first phase shift element, which is configured to impart one or more phase shifts to the first and second RF signals to establish a phase difference between the signals at the outputs 324, 326 (e.g., about a 90 degree phase difference). In a non-inverted Doherty amplifier, the phase shift(s) are applied so that the phase of the RF signal provided to the carrier amplifier lags the phase of the RF signal provided to the peaking amplifier by about 90 degrees. Conversely, in an inverted Doherty amplifier, the phase shift(s) are applied so that the phase of the RF signal provided to the peaking amplifier lags the phase of the RF signal provided to the carrier amplifier by about 90 degrees. Either way, at outputs 324 and 326, the carrier and peaking signals may be about 90 degrees out of phase from each other.

When Doherty amplifier 300 has a symmetrical configuration (i.e., a configuration in which the carrier and peaking amplifier power transistors are substantially identical in size), the power splitter 320 may divide or split the input RF signal received at the input 322 into two signals that are very similar with, in some embodiments, equal power. Conversely, when Doherty amplifier 300 has an asymmetrical configuration (i.e., a configuration in which one of the amplifier power transistors, typically the peaking amplifier transistor, is significantly larger), the power splitter 320 may output signals having unequal power. In some embodiments, the power splitter 320 may be implemented with fixed-value, passive components. In other embodiments, the power splitter 320 may be implemented with one or more controllable variable attenuators and/or variable phase shifters, which enable the power splitter 320 to attenuate and/or phase shift the carrier and peaking signals based on externally-provided control signals.

The outputs 324, 326 of the power splitter 320 are connected to the carrier and peaking amplifier paths 330, 350, respectively. The carrier amplifier path 330 is configured to amplify the carrier signal from the power splitter 320, and to provide the amplified carrier signal to the power combining node 380. Similarly, the peaking amplifier path 350 is configured to amplify the peaking signal from the power splitter 320, and to provide the amplified peaking signal to the power combining node 380, where the paths 330, 350 are designed so that the amplified carrier and peaking signals arrive substantially in phase with each other at the power combining node 380. Overall, to ensure that the amplified RF signal produced by the carrier amplifier 332 and the amplified RF signal produced by the peaking amplifier 352 combine in phase at the combining node 380, the total electrical length between the intrinsic drain nodes of the output transistors of dies 332, 352 should be about 90 degrees.

According to an embodiment, the carrier amplifier path 330 includes an input circuit 325 (e.g., including an impedance matching circuit), a carrier amplifier die 332 (e.g., a first power transistor die, such as die 432, FIGS. 4-9), and impedance inverter line assembly 370. The carrier amplifier die 332 includes an RF input terminal 334, an RF output terminal 338, and one or more amplification stages coupled between the input and output terminals 334, 338, in various embodiments. The RF input terminal 334 is coupled through input circuit 325 to the first output 324 of the power splitter 320, and thus the RF input terminal 334 receives the carrier signal produced by the power splitter 320. A drain bias voltage terminal 317 may be coupled to an external bias circuit for providing a DC bias voltage to the RF output terminal 338 of the carrier amplifier die 332 (e.g., the drain terminal).

Each amplification stage of the carrier amplifier die 332 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 334, one of the current-carrying terminals (e.g., the drain terminal or the source terminal) is electrically connected to the RF output terminal 338, and the other current-carrying terminal (e.g., the source terminal or the drain terminal) is electrically connected to a ground reference (or another voltage reference). Conversely, a two-stage device would include two power transistors coupled in series, where a first transistor functions as a driver amplifier transistor that has a relatively low gain, and a second transistor functions as an output amplifier transistor that has a relatively high gain. In such an embodiment, the control terminal of the driver amplifier transistor is electrically connected to the RF input terminal 334, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 338, and the other current-carrying terminal of the output amplifier transistor (e.g., the source terminal or the drain terminal) is electrically connected to the ground reference (or another voltage reference).

In addition to the power transistor(s), portions of input and output impedance matching networks and bias circuitry (not illustrated in FIG. 3) also may be monolithically formed as portions of the carrier amplifier die 332 and/or electrically coupled to the carrier amplifier die 332. Further, in an embodiment in which the carrier amplifier die 332 is a two-stage device, an interstage matching network (not illustrated in FIG. 3) also may be monolithically formed as a portion of the carrier amplifier die 332.

The RF output terminal 338 of the carrier amplifier die 332 is coupled to the impedance inverter line assembly 370. As will be discussed in detail below, an embodiment of an impedance inverter line assembly 370 includes a microstrip transmission line 374 and electrical connections 373, 375 between the outputs of the carrier and peaking amplifier dies 332, 352 and opposite ends of the microstrip transmission line 374.

Essentially, the RF output terminal 338 of the carrier amplifier die 332 is coupled to the power combining node 380 through the impedance inverter line assembly 370. According to an embodiment, the impedance inverter line assembly 370 is a lambda/4 ($\lambda/4$) phase shift circuit, which imparts about a 90 degree relative phase shift to the carrier signal after amplification by the carrier amplifier die 332. A first end of the impedance inverter line assembly 370 is coupled to the RF output terminal 338 of the carrier amplifier die 332, and a second end of the impedance inverter line assembly 370 is coupled to the power combining node 380.

According to several embodiments, which will be described in more detail in conjunction with FIGS. 4-6, a directional coupler 360 is implemented on the substrate 310 in proximity to the microstrip transmission line 374, and thus in proximity to the impedance inverter line assembly 370. The directional coupler 360 includes a transmission line 361, which is arranged in parallel with, but electrically isolated from, a section of the transmission line 374 of the impedance inverter line assembly 370. The section of the transmission line 374 may be referred to herein as a "main line" of the directional coupler 360, and the transmission line 361 may be referred to herein as a "coupled line" of the directional coupler 360. The transmission lines 361, 374 are arranged to have a coupling factor between them in a range of about 10 decibels (dB) to about 40 dB, in an embodiment, or between about 20 dB and about 30 dB, in another embodiment, although the coupling factor may be lower or higher than these ranges, in other embodiments. Desirably, the transmission lines 361, 374 are arranged to have an insertion loss that is less than about 0.2 dB, in an embodiment, or less than about 0.02 dB, in another embodiment. In addition, the transmission lines 361, 374 have isolation of at least 10 dB greater than the coupling factor, in an embodiment. In other embodiments, the coupling factor, insertion loss, and/or isolation may be smaller or larger than the above-given values or ranges.

The directional coupler transmission line 361 and the section of the impedance inverter transmission line 374 to which the directional coupler transmission line 361 is proximate each have an electrical length in a range of about lambda/8 (i.e., about one eighth of the wavelength of a center frequency of operation of the amplifier 300) to about lambda/4 (i.e., about one fourth of the wavelength of the center frequency of operation of the amplifier 300) although the lengths may be shorter or longer, as well. The section of the impedance inverter transmission line 374 to which the directional coupler transmission line 361 is proximate has first and second ends, which can be analogized to two ports of a parallel-coupled directional coupler (e.g., an input port and a direct port). Essentially, the first port (e.g., input port) is electrically connected to the output of the carrier amplifier die 332, and the second port (e.g., direct port) is electrically connected to the output of the peaking amplifier die 352. The directional coupler transmission line 361 also has first and second ends, which can be analogized to two other ports of a parallel-coupled directional coupler (e.g., an isolated port and a coupled port). According to an embodiment, the first port (e.g., isolated port) is electrically coupled to a terminal 368, which in turn may be coupled to an externally terminated resistor 366 (e.g., a 50 ohm resistor connected to a ground reference). In an alternate embodiment, all or a portion of the resistance provided by the externally terminated resistor 366 may be implemented with a resistor 367 connected to the substrate 310. The second port (e.g., coupled port) is electrically coupled to a directional coupler output terminal 364.

The directional coupler output terminal 364, in turn, may be connected through an external termination tuning circuit 362 (e.g., termination tuning circuit 1000, FIG. 10) to a feedback path to a DPD module (e.g., through feedback path 262 to DPD block 216, FIG. 2). In an alternate embodiment, all or a portion of the external termination tuning circuit 362 may be implemented with an internal termination tuning circuit 363 connected to the substrate 310. Whether implemented externally and/or internally, the termination tuning circuit 362, 363 functions to improve the directivity of the directional coupler 360 by compensating for the reactance associated with termination resistor 366 and/or 367 at high frequencies. Although the tuning circuit 362, 363 is shown to be coupled to the output terminal 364 in FIG. 3, in alternate embodiments, the tuning circuit 362, 363 could be coupled to terminal 368 between transmission line 361 and resistor 366 and/or 367. As will be explained in more detail later, during operation of amplifier 300, the directional coupler 360 is configured to produce, at terminal 364, an RF signal that is a low-power replica of the forward RF signal conveyed through transmission line 374 (or through the impedance inverter assembly 370).

Reference is now made to the peaking amplifier path 350, which includes a peaking amplifier die 352 (e.g., a second power transistor die, such as die 452, FIGS. 4-9) and an input circuit 327 (e.g., including an impedance matching circuit), in an embodiment. The peaking amplifier die 352 includes an RF input terminal 354, an RF output terminal 358, and one or more amplification stages coupled between the input and output terminals 354, 358, in various embodiments. The RF input terminal 354 is coupled to the second output 326 of the power splitter 320, and thus the RF input terminal 354 receives the peaking signal produced by the power splitter 320. A drain bias voltage terminal 318 may be coupled to an external bias circuit for providing a DC bias voltage to the RF output terminal 358 of the peaking amplifier die 352 (e.g., the drain terminal).

As with the carrier amplifier die 332, the peaking amplifier die 352 may be a single-stage or a multiple-stage amplifier, where each amplification stage of the peaking amplifier die 352 includes a power transistor with a control terminal and first and second current-carrying terminals. The power transistor(s) of the peaking amplifier die 352 may be electrically coupled between the RF input and output terminals 354, 358 in a manner similar to that described above in conjunction with the description of the carrier amplifier die 332. Additional other details discussed with in conjunction with the description of the carrier amplifier die 332 also apply to the peaking amplifier die 352, and those additional details are not reiterated here for brevity.

The RF output terminal 358 of the peaking amplifier die 352 is coupled to the power combining node 380 and to the impedance inverter line assembly 370. According to an embodiment, the RF output terminal 358 of the peaking amplifier die 352 and the combining node 380 are implemented with a common physical element. More specifically, in an embodiment, the RF output terminal 358 of the peaking amplifier die 352 is configured to function both as the combining node 380 and as the output terminal 358 of the peaking amplifier die 352. The amplifier 300 is designed so that, during operation, the amplified carrier and peaking RF signals combine substantially in phase at the combining node 380.

The combining node 380 is electrically coupled to the RF output node 319 through an output microstrip transmission line 396 to provide the amplified and combined RF output signal to the RF output node 319. In an embodiment, the output transmission line 396 and additional components (not illustrated in FIG. 3) form an output impedance matching network 384 between the combining node 380 and the RF output node 319, where the output impedance matching network 384 functions to present proper load impedances to each of the carrier and peaking amplifier die 332, 352. The resulting amplified RF output signal is produced at RF output node 319, to which an output load 390 (e.g., an antenna) is connected.

Figure 7:
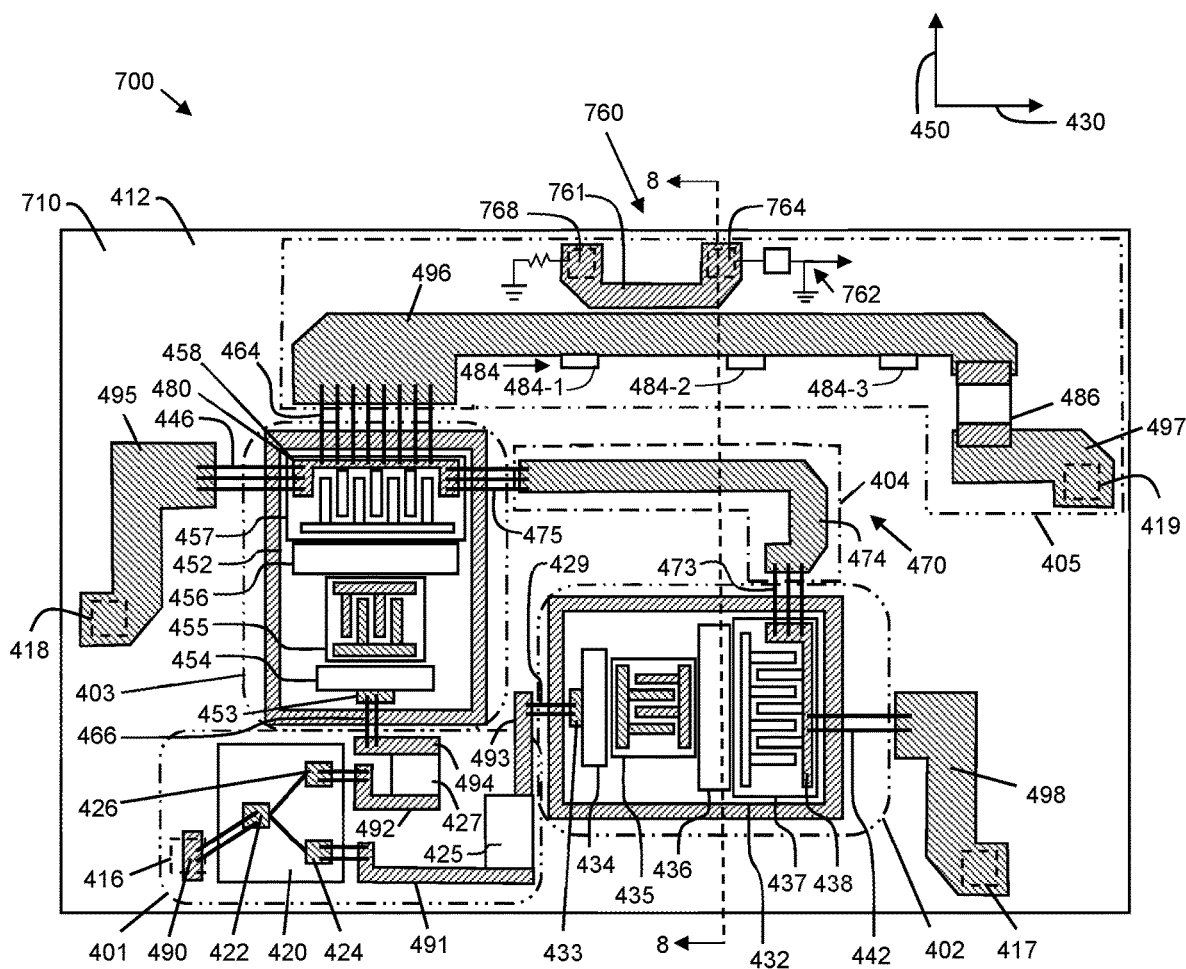
FIG. 7 is a top view of a Doherty amplifier module, in accordance with another example embodiment.

According to several alternate embodiments, which will be described in more detail in conjunction with FIGS. 7-9, a directional coupler 360' is implemented on the substrate 310, instead of the embodiments of directional coupler 360 that were previously described. The directional coupler 360' includes a transmission line 361', which is arranged in parallel with, but electrically isolated from, a section of the output transmission line 396. The section of the output transmission line 396 may be referred to herein as a "main line" of the directional coupler 360', and the transmission line 361' may be referred to herein as a "coupled line" of the directional coupler 360'. The transmission lines 361', 396 are arranged to have a coupling factor between them in a range of about 10 dB to about 40 dB, in an embodiment, or between about 20 dB and about 30 dB, in another embodiment, although the coupling factor may be lower or higher than these ranges, in other embodiments. Desirably, the transmission lines 361', 396 are arranged to have an insertion loss that is less than about 0.2 dB, in an embodiment, or less than about 0.02 dB, in another embodiment. In addition, the transmission lines 361', 396 have isolation of at least 10 dB greater than the coupling factor, in an embodiment. In other embodiments, the coupling factor, insertion loss, and/or isolation may be smaller or larger than the above-given ranges or values.

The directional coupler transmission line 361' and the section of the output transmission line 396 to which the directional coupler transmission line 361' is proximate each have an electrical length in a range of about lambda/8 to about lambda/4, although the lengths may be shorter or longer, as well. The section of the output transmission line 396 to which the directional coupler transmission line 361' is proximate has first and second ends, which can be analogized to two ports of a parallel-coupled directional coupler (e.g., an input port and a direct port). Essentially, the first port (e.g., input port) is electrically connected to the combining node 380 (or the output of the peaking amplifier die 352), and the second port (e.g., direct port) is electrically connected to the output terminal 319 of the amplifier 300. The directional coupler transmission line 361' also has first and second ends, which can be analogized to two other ports of a parallel-coupled directional coupler (e.g., an isolated port and a coupled port). According to an embodiment, the first port (e.g., isolated port) is electrically coupled to a terminal 368', which in turn may be coupled to an externally terminated resistor 366' (e.g., a 50 ohm resistor connected to a ground reference). In an alternate embodiment, all or a portion of the resistance provided by the externally terminated resistor 366' may be implemented with a resistor 367' connected to the substrate 310. The second port (e.g., coupled port) is electrically coupled to a directional coupler output terminal 364'.

The directional coupler output terminal 364', in turn, may be connected through an external termination tuning circuit 362' (e.g., termination tuning circuit 1000, FIG. 10) to a feedback path to a DPD module (e.g., through feedback path 262 to DPD block 216, FIG. 2). In an alternate embodiment, all or a portion of the external termination tuning circuit 362' may be implemented with an internal termination tuning circuit 363' connected to the substrate 310. Whether implemented externally and/or internally, the termination tuning circuit 362', 363' functions to improve the directivity of the directional coupler 360' by compensating for the reactance associated with termination resistor 366' and/or 367' at high frequencies. Although the tuning circuit 362', 363' is shown to be coupled to the output terminal 364' in FIG. 3, in alternate embodiments, the tuning circuit 362', 363' could be coupled to terminal 368' between transmission line 361' and resistor 366' and/or 367'. As will be explained in more detail later, during operation of amplifier 300, the directional coupler 360' is configured to produce, at terminal 364', an RF signal that is a low-power replica of the forward RF signal conveyed through output transmission line 396.

Amplifier 300 is configured so that the carrier amplifier path 330 provides amplification for relatively low level input signals, and both amplification paths 330, 350 operate in combination to provide amplification for relatively high level input signals. This may be accomplished, for example, by biasing the carrier amplifier die 332 so that the carrier amplifier die 332 operates in a class AB mode, and biasing the peaking amplifier die 352 so that the peaking amplifier die 352 operates in a class C mode.

According to an embodiment, the physical components of the carrier and peaking paths 330, 350 are oriented, with respect to each other, so that corresponding portions of the carrier and peaking amplification paths 330, 350 extend in directions that are substantially different from each other. As used herein, the term "signal path" refers to the path followed by an RF signal through a circuit. For example, a portion of a first signal path through the carrier amplifier die 332 extends in a first direction (indicated by arrow 330) between the RF input and output terminals 334, 338. Similarly, a portion of a second signal path through the peaking amplifier die 352 extends in a second direction (indicated by arrow 350) between the RF input and output terminals 354, 358, where the first and second directions are substantially different from each other. In the illustrated embodiment, the first and second directions are perpendicular to each other (i.e., angularly separated by 90 degrees). In other embodiments, the first and second directions may be angularly separated by less or more than 90 degrees. For example, the first and second directions may be angularly separated by any angle between 45 degrees and 315 degrees, in other embodiments. According to an embodiment, the angular separation between directions of the portions of the first and second signal paths that traverse the carrier and peaking amplifier die 332, 352 is achieved by orienting the carrier and peaking amplifier die 332, 352 so that the signal paths between their respective RF input and output terminals 334, 338, 354, 358 are angularly separated. For example, the carrier and peaking amplifier die 332, 352 are oriented perpendicularly, in an embodiment, so that the directions of the portions of the signal paths through the carrier and peaking amplifier die 332, 352 also are perpendicular.

Embodiments of a physical implementation of the Doherty amplifier circuit of FIG. 3, which include embodiments of a directional coupler 360 proximate a microstrip transmission line 374 of the impedance inverter line assembly 370 now will be described in detail in conjunction with FIGS. 4-6. More specifically, FIG. 4 is a top view of a Doherty amplifier module 400, in accordance with various example embodiments. FIG. 4 should be viewed simultaneously with FIGS. 5 and 6, which are cross-sectional, side views of two embodiments of a portion of the module 400 of FIG. 4 along line 5-5. Where components in FIGS. 4-6 correspond to substantially similar or identical components, the same reference numbers are used.

Doherty amplifier module 400 includes a substrate 410, a power splitter 420 (e.g., power splitter 320, FIG. 3), a carrier amplifier die 432 (e.g., carrier amplifier die 332, FIG. 3), a peaking amplifier die 452 (e.g., peaking amplifier die 352, FIG. 3), a phase shift and impedance inversion assembly 470 (e.g., phase shift and impedance inversion assembly 370, FIG. 3), a directional coupler 460 (FIG. 4, 5) or 460' (FIG. 6), and various other circuit elements, which will be discussed in more detail below.

The Doherty amplifier module 400 may be implemented as a land grid array (LGA) module, for example. Accordingly, and referring to FIGS. 4-6 simultaneously, the substrate 410 has a component mounting surface 412 (also referred to herein as an "upper" or "top" surface) and a land surface 514 (also referred to herein as a "lower" or "bottom" surface). Conductive landing pads 416, 417, 418, 419, 464, 468 of the LGA are exposed at the land surface 514, where the locations of the example landing pads 416-419, 464, 468 are indicated with dashed boxes in FIG. 4. Although module 400 is depicted as an LGA module, module 400 alternatively may be packaged as a pin grid array module, a quad flat no leads (QFN) module, or another type of package. Either way, the component mounting surface 412 and the components mounted to that surface 412 optionally may be covered with an encapsulant material (e.g., encapsulant material 530, FIGS. 5, 6, such as a plastic encapsulant). In an alternate embodiment, the components could be contained within an air cavity, which is defined by various structures (not illustrated) overlying the mounting surface 412.

Substrate 410 may be a multi-layer organic substrate (e.g., formed from printed circuit board (PCB) materials), which includes a plurality of metal layers 508, 509, 510, 511, 512, 513, 514, 515 that are separated by (or interleaved with) a plurality dielectric material layers 518, 519, 520, 521, 522, 523, 524. Conductive vias (e.g., via 517), which extend through the dielectric material layers 518-524, provide for electrical connectivity between the metal layers 508-515.

Each of the carrier and peaking amplifier die 432, 452 are monolithic power transistor integrated circuits (ICs) that may produce significant amounts of heat during operation. In addition, each of the carrier and peaking amplifier die 432, 452 also need access to a ground reference (e.g., to the system ground plane). Accordingly, in an embodiment, substrate 410 also includes a plurality of electrically and thermally conductive trenches 580 to which the carrier and peaking amplifier die 432, 452 are electrically and thermally coupled (e.g., with solder, brazing material, silver sinter, or other die attach materials). The trenches 580 extend through an entirety of the substrate thickness to provide heat sinks and ground reference access to the carrier and peaking amplifier die 432, 452. For example, the conductive trenches 580 may be filled with copper or another thermally and electrically conductive material. In alternate embodiments, the trenches 580 may be replaced with conductive slugs (e.g., copper slugs) or with thermal vias.

According to an embodiment, the lowest internal metal layer 508 (i.e., the internal metal layer closest to bottom surface 514) is utilized to provide the conductive landing pads 416-419, 464, 468 of the LGA. Further, an additional metal layer 506 may be formed on the bottom surface 514 of the substrate 410, where the additional metal layer 506 may be utilized to convey a ground reference to the module 400. The metal layer 506 and landing pads 416-419, 464, 468 (among others, not illustrated) enable surface mounting of the Doherty amplifier module 400 onto a separate substrate (not illustrated) that provides electrical connectivity to other portions of an RF system (e.g., to DAC 220, DPD 216, and antenna 250, FIG. 2).

Some metal layers of the substrate 410 may be used to convey DC voltages (e.g., DC bias voltages) and to provide access to a system ground reference. Other layers may be used to convey RF and other signals to the module 400. Additionally, a patterned metal layer 515 may be formed on the mounting surface 412 of the substrate 410. As will be described in more detail below, the patterned metal layer 515 may include a plurality of conductive contacts, microstrip lines, and traces (e.g., elements 461, 490-494, 474, 495-498) on the mounting surface 412, which facilitates electrical connection to die and other components that are coupled to the mounting surface 412.

Although substrate 410 is depicted to include seven internal metal layers 508-514, and seven dielectric material layers 518-524, substrates that include more or fewer metal layers and/or more or fewer dielectric material layers alternatively may be used. Either way, each of the dielectric material layers 518-524 may have a thickness (vertical dimension in FIGS. 5, 6) in a range of about 50 microns to about 100 microns, although the thickness of each layer 518-524 may be smaller or larger, as well. In some embodiments, each of the dielectric material layers 518-524 have substantially the same thickness, while in other embodiments, the dielectric material layers 518-524 may have different thicknesses. Given the above example ranges, substrate 410 may have a total thickness between the top and bottom surfaces 412, 514 in a range of about 350 microns to about 700 microns, although the thickness of substrate 410 may be smaller or larger, as well.

According to an embodiment, the substrate 410 is relatively small, which provides for a particularly compact Doherty amplifier. For example, the component mounting surface 412 may have a width (horizontal dimension in FIG. 4) and a length (vertical dimension in FIG. 4) in a range of about 5 millimeters (mm) to about 40 mm, although the width and/or length may be smaller or larger, as well. In a particular embodiment, for example, the component mounting surface may have a width of about 10 mm and a length of about 6 mm.

A plurality of non-overlapping zones is defined at the mounting surface 412 of the substrate 410, where each zone includes the portion of the substrate 410 within the indicated zone boundaries and between the mounting surface 412 and the land surface 514. More specifically, the non-overlapping zones include an input signal and splitter zone 401, a first-die mounting zone 402, a second-die mounting zone 403, an inter-amplifier impedance inverter zone 404 (referred to herein as an "inverter zone"), and an output match zone 405. Within the input signal and splitter zone 401, a conductive landing pad 416 exposed at the land surface 514 is electrically coupled through the substrate 410 to a conductive contact 490 at the mounting surface 412. The landing pad 416 and contact 490, along with the electrical connections between them, function as the RF input node (e.g., RF input node 312, FIG. 3) for the module 400.

The power splitter 420 is coupled to the mounting surface 412 in the input signal zone 401. According to an embodiment, the power splitter 420 may include one or more discrete die and/or components, although it is represented in FIG. 4 as a single element. The power splitter includes an input terminal 422 (e.g., input 322, FIG. 3) and two output terminals 424, 426 (e.g., outputs 324, 326, FIG. 3). The input terminal 422 is electrically coupled (e.g., through wirebonds, as shown) to conductive contact 490 to receive an input RF signal. In addition, the output terminals 424, 426 are electrically coupled (e.g., through additional wirebonds, as shown) to conductive contacts 491, 492 at the mounting surface 412. The power splitter 420 is configured to split the power of the input RF signal received through input terminal 422 into first and second RF signals (e.g., carrier and peaking signals), which are produced at the output terminals 424, 426. In addition, the power splitter 420 may include one or more phase shift elements configured to impart about a 90-degree phase difference between the first and second RF signals provided at output terminals 424, 426. The power splitter 420 may consist of fixed-value, passive components, and/or the power splitter 420 may include variable phase shifters and/or variable attenuators.

The first and second RF signals may have equal or unequal power, as discussed previously. The first RF signal produced at output terminal 424 and conveyed to conductive contact 491 is amplified through a carrier amplifier path. The carrier amplifier path includes an input circuit 425 (e.g., input circuit 325, FIG. 3) mounted within the input signal zone 401, a carrier amplifier die 432 (e.g., die 332, FIG. 3) mounted within the first-die mounting zone 402, and a phase shift and impedance inversion assembly 470 (e.g., phase shift and impedance inversion assembly 370, FIG. 3). The phase shift and impedance inversion assembly 470 includes a series combination of a microstrip transmission line 474 (or "impedance inverter line") (e.g., microstrip transmission line 374, FIG. 3) connected to the substrate 410 within the inverter zone 404, and wirebond arrays 473, 475 that electrically connect the impedance inverter line 474 to the outputs of dies 432, 452.

The input circuit 425 is electrically connected between conductive contacts 491 and 493. Although the detail is not shown in FIG. 4, the input circuit 425 may include a plurality of discrete and/or integrated components (e.g., inductors and capacitors) configured to provide proper impedance matching between the first power splitter output 424 and the input to the carrier die 432.

Conductive contact 493 is electrically coupled (e.g., with wirebonds 429) to an RF input terminal 433 of the carrier amplifier die 432, in order to provide an RF carrier signal for amplification to the carrier amplifier die 432. The illustrated embodiment of carrier amplifier die 432 embodies a two-stage amplifier. More specifically, the electrical components of carrier amplifier die 432 include an RF input terminal 433, an integrated input matching network 434, a driver stage transistor 435, an integrated interstage matching network 436, an output or final-stage transistor 437, and an RF output terminal 438. The driver and output transistors 435, 437 are coupled in series between the input and output terminals 433, 438. The driver transistor 435 is configured to apply a relatively low gain to the carrier signal, and the output transistor 437 is configured to apply a relatively high gain to the carrier signal after preliminary amplification by the driver transistor 435. In other embodiments, the carrier amplifier die 432 may embody a single stage amplifier or may include more than two amplification stages.

Each of the transistors 435, 437 may be a field effect transistor (FET) (such as a metal oxide semiconductor FET (MOSFET), a laterally diffused MOSFET (LDMOS FET), a high electron mobility transistor (HEMT), and so on). Alternatively, each of the transistors 435, 437 may be a bipolar junction transistor (BJT). References herein to a "gate," "drain," and "source," which are commonly used to describe FETs, are not intended to be limiting, as each of these designations has analogous features for BJT implementations. In various embodiments, the semiconductor substrates on which transistors 435, 437 are formed may comprise silicon, silicon-on-insulator (SOI), silicon-on-sapphire (SOS), gallium arsenide (GaAs), gallium nitride (GaN), GaN on silicon carbide, GaN on silicon, or other types of substrate materials.

The input terminal 433 of die 432 is electrically coupled to the gate terminal of transistor 435 through input matching network 434, and the drain terminal of transistor 435 is electrically coupled to the gate terminal of transistor 437 through inter-stage matching network 436. According to an embodiment, the drain terminal of transistor 437 is electrically coupled to output terminal 438. Accordingly, the signal path through the carrier amplifier die 432 is in a direction extending from the RF input terminal 433 toward the RF output terminal 438, which direction is indicated by arrow 430.

An amplified RF carrier signal is produced by the carrier amplifier die 432 at the RF output terminal 438. An external bias circuit (not illustrated) may be connected to the output terminal 438 of the carrier amplifier die 432 through wirebonds 442, conductive pad 498, and landing pad 417. When integrated with a larger RF system, landing pad 417 may be connected to the external bias circuit, which may provide a DC bias voltage to the output terminal 438, and thus to the drain of transistor 437. Bias voltages provided to the gates and/or drains of the transistors 435, 455, 437, 457 facilitate Doherty operation of the module. For example, the transistors 435, 437 of the carrier amplifier die 432 may be biased to operate in class AB mode, and the transistors 455, 457 of the peaking amplifier die 452 may be biased to operate in class C mode.

A phase shift and impedance inversion assembly 470, which includes wirebond arrays 473, 475 and impedance inverter line 474 (e.g., microstrip transmission line 374, FIG. 3), is coupled to the substrate 410 in the inverter zone 404. Impedance inverter line 474 may be a microstrip transmission line that is formed, for example, from a portion of conductive layer 515 on the mounting surface 412 of the module substrate 410. In other embodiments, the impedance inverter line 474 also or alternatively may be formed from portion(s) of one or more lower metal layers. In an embodiment, the RF output terminal 438 of die 432 is electrically coupled, through a first wirebond array 473 (i.e., a plurality of parallel, closely spaced wirebonds), to a first end of impedance inverter line 474. In addition, the RF output terminal 458 of die 452 is electrically coupled, through a second wirebond array 475 (i.e., a plurality of parallel, closely spaced wirebonds), to a second end of impedance inverter line 474.

According to an embodiment, impedance inverter line 474 is implemented with a transmission line (e.g., a microstrip line) having an electrical length of less than lambda/4 ($\lambda/4$), where lambda corresponds to the wavelength of a center frequency within a bandwidth of operation of the module 400. The impedance inverter line 474 has a first end that is proximate to the carrier amplifier die 432 (and more particularly within a wirebond length of the RF output terminal 438), and a second end that is proximate to the peaking amplifier die 452 (and more particularly within a wirebond length of the RF output terminal 458 of the peaking amplifier die 452). As used herein, "within a wirebond length" means within a distance between about 125 microns and about 400 microns, although the term may mean a smaller or larger distance, as well.

The impedance inverter line 474 is physically defined by a width, a thickness (i.e., vertical dimension in FIGS. 5, 6), and a length (i.e., a physical length of the path between first and second ends that are proximate to wirebonds 473 and 475, respectively). In some embodiments, the width of the impedance inverter line 474 may be between about 450 microns and about 4000 microns, although the width may be smaller or larger, as well. The thickness of the impedance inverter line 474 may be in a range of about 40 microns to about 50 microns, although the thickness may be smaller or larger, as well. Finally, the length of the impedance inverter line 474 may be in a range of about 4000 microns to about 10000 microns, although the length may be smaller or larger, as well.

The characteristic impedance of the impedance inverter line 474 is dictated by the power level of the Doherty design (i.e., by the peripheries of the carrier and peaking die 432, 452 and the peaking-to-carrier ratio). Further, for a desired characteristic impedance, the width of the impedance inverter line 474 is determined based on the dielectric constant of the substrate 410 and the distance between the impedance inverter line 474 and the system ground plane.

In an embodiment, a ground plane height variation structure (e.g., structure 540) underlying the impedance inverter line 474 is used to effectively decrease the distance, through the substrate 410, between the impedance inverter line 474 and the system ground plane. Accordingly, the ground plane height variation structure may be used to alter the characteristic impedance of the impedance inverter line 474. In alternate embodiments, module 400 may exclude the ground plane height variation structure, and the system ground plane may be provided using a conductive layer (e.g., layer 506) coupled to the bottom surface 514 of the substrate 410.

Generally, a ground plane height variation structure includes one or more conductive features that are configured to provide an electrically conductive path between the bottom surface 514 of the substrate 410 and an interior point or plane within the substrate 410 that is located between the bottom and top surfaces 514, 412 of the substrate 410.

According to an embodiment, ground plane height variation structure 540 includes one or more conductive features 581 (e.g., conductive vias) that extend from the bottom surface 514 of the substrate 410 toward but not to the top surface 412 of the substrate 410, and a conductive plane 582 embedded within the substrate 410 between the top and bottom surfaces 412, 514 of the substrate 410. The conductive plane 582 may be formed from a portion of an internal metal layer (e.g., layer 510), which electrically connects the plurality of conductive features 581. The conductive plane 582 is considered an upper boundary of the ground plane height variation structure 540, and the ground plane height variation structure 540 provides an electrically conductive path (including layer 582 and vias 581) between the upper boundary of the structure 540 and the land surface 514 of the substrate 410.

When the ground plane height variation structure 540 is electrically coupled to the system ground reference (or plane), the ground plane height variation structure 540 functions to raise (physically elevate) the system ground plane to the height 552 of the conductive plane 582. In FIGS. 5 and 6, this height 552 is less than half the total thickness of the substrate 410 between top and bottom surfaces 412, 514, although the height alternatively could be equal to half or more than half. All other things being equal (e.g., the physical dimensions of the impedance inverter line 474), this elevation of the system ground plane results in a decrease in the characteristic impedance of the impedance inverter line 474.

As described in conjunction with FIG. 3, and according to several embodiments, module 400 also includes a directional coupler 460 (FIG. 5) or 460' (FIG. 6) (e.g., directional coupler 360, FIG. 3) implemented on the substrate 410 in proximity to the microstrip transmission line 474, and thus in proximity to the impedance inverter line assembly 470.

Figure 5:
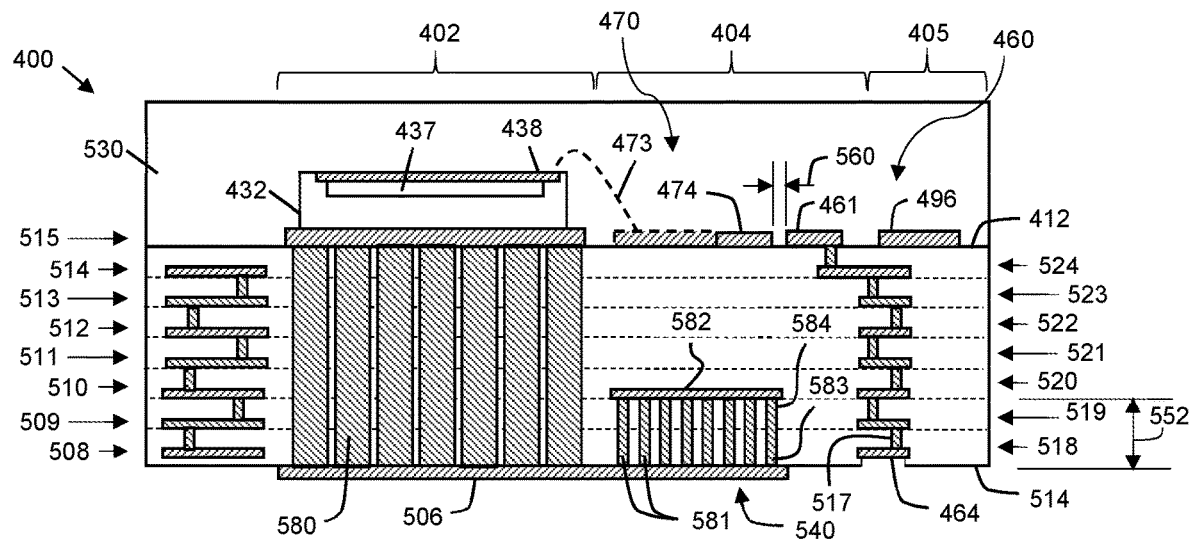
FIG. 5 is a cross-sectional, side view of the module of FIG. 4 along line 5-5, in accordance with an example embodiment.

According to one embodiment, as illustrated in FIG. 5, the directional coupler 460 includes a section of the microstrip transmission line 474 (or main line), a transmission line 461 (or coupled line) formed from a portion of conductive layer 515 on the mounting surface 412 of the module 400, a first conductive structure formed from a series of electrically connected features (e.g., conductive vias and traces) that extends through the substrate 410 to electrically connect a first end of the transmission line 461 to a first conductive landing pad 468 (e.g., terminal 368) exposed at the land surface 514, and a second conductive structure formed from another series of electrically connected features (e.g., conductive vias and traces) that extends through the substrate 410 to electrically connect a second end of the transmission line 461 to a second conductive landing pad 464 (e.g., terminal 364) exposed at the land surface 514.

In the embodiment shown in FIG. 5, transmission lines 461, 474 are formed from portions of a same conductive layer (e.g., layer 515), and accordingly transmission lines 461, 474 are co-planar (i.e., with the plane being defined by mounting surface 412) with sides of the transmission lines 461, 474 extending in parallel with each other along the length of transmission line 461. Transmission line 461 is arranged in parallel with, but electrically isolated from, a section of the transmission line 474 of the impedance inverter line assembly 470. A gap having width 560 is present between transmission lines 461, 474 (along the length of transmission line 461), which ensures electrical isolation between the transmission lines 461, 474. However, the gap width 560 is small enough to ensure sufficient electromagnetic communication between the transmission lines 461, 474 so as to produce, during operation of module 400, a low-power replica along transmission line 461 of the forward RF signal conveyed through transmission line 474. This low-power replica signal is, in turn, produced at landing pad 464 during operation. In the embodiment of FIG. 5, the gap between transmission lines 461, 474 is an air gap, or a gap that is filled with the material of encapsulant 530 (when included).

Figure 6:
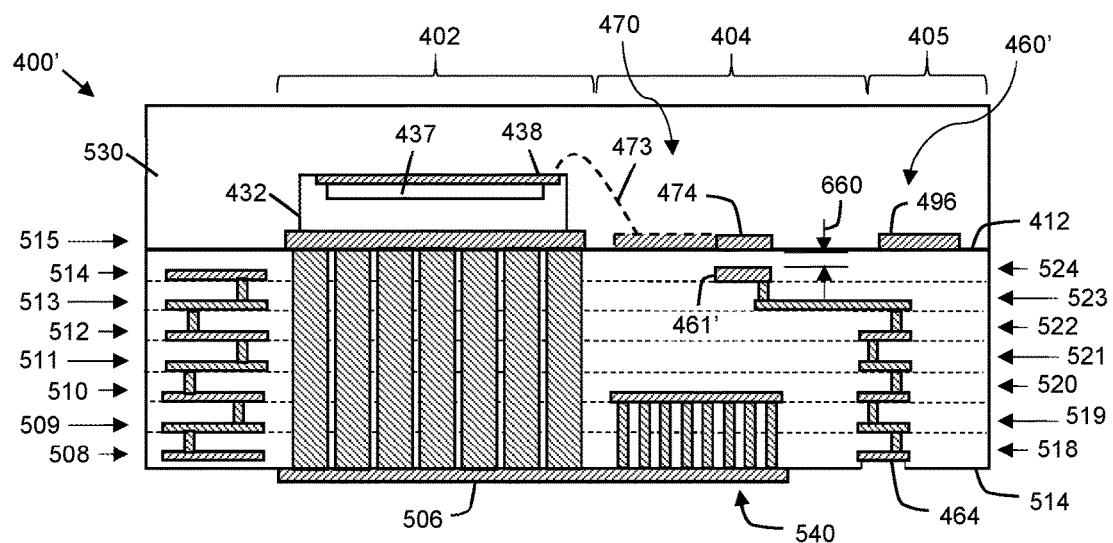
FIG. 6 is a cross-sectional, side view of the module of FIG. 4 along line 5-5, in accordance with another example embodiment.

According to another embodiment, as illustrated in FIG. 6, the directional coupler 460' includes a section of the microstrip transmission line 474 (or main line), a transmission line 461' (or coupled line) formed from a portion of an internal conductive layer (e.g., layer 514) that is below the mounting surface 412 of the module 400', a first series of electrically connected conductive structures (e.g., conductive vias and traces) that electrically connect a first end of the transmission line 461' to a first conductive landing pad 468 (e.g., terminal 368) exposed at the land surface 514, and a second series of electrically connected conductive structures (e.g., conductive vias and traces) that electrically connect a second end of the transmission line 461' to a second conductive landing pad 464 (e.g., terminal 364) exposed at the land surface 514.

In the embodiment shown in FIG. 6, transmission lines 461', 474 are formed from portions of different conductive layers (e.g., layers 514, 515), where those portions of the different conductive layers are non-co-planar, but vertically aligned with each other (i.e., overlapping in the vertical dimension from the perspective of FIG. 6). In other words, the top and bottom surfaces, respectively, of transmission lines 461', 474 extend in parallel with each other along the length of transmission line 461', which length may be approximately equal to the length of transmission line 461 depicted in FIG. 4. Again, transmission line 461' is arranged in parallel with, but electrically isolated from, a section of the transmission line 474 of the impedance inverter line assembly 470. A gap having width 660 is present between transmission lines 461', 474 (along the length of transmission line 461'), which ensures electrical isolation between the transmission lines 461', 474. However, the gap width 660 is small enough to ensure sufficient electromagnetic communication between the transmission lines 461', 474 so as to produce, during operation of module 400', a low-power replica along transmission line 461' of the forward RF signal conveyed through transmission line 474. This low-power replica signal is, in turn, produced at landing pad 464 during operation. In the embodiment of FIG. 6, the gap between transmission lines 461', 474 is filled with dielectric material of dielectric material layer 524. In other embodiments, transmission line 461' may be formed from a portion of another lower conductive layer (e.g., one of layers 509-513), in which case the gap would be filled with dielectric material of multiple dielectric layers (e.g., a set of consecutive layers 519-523).

In either embodiment, the gap width 560, 660 is selected based on a desired coupling factor. For example, with respect to the embodiment of FIG. 5, the gap width 560 may be in a range of about 1 mil to about 10 mil, in an embodiment, or in a range of about 3 mil to about 5 mil, in another embodiment, although the gap width 560 may be smaller or larger, as well. With respect to the embodiment of FIG. 6, the gap width 660 will be a factor of the thickness of the dielectric layer(s) between the transmission lines 461', 474. For example, the gap width 660 may be in a range of about 0.5 mil to about 20 mil, in an embodiment, or in a range of about 5 mil to about 10 mil, in another embodiment, although the gap width 660 may be smaller or larger, as well. As described previously, the transmission lines 461 (or 461'), 474 are arranged to have a coupling factor between them of about 10 dB to about 40 dB, in an embodiment, or between about 20 dB and about 30 dB, in another embodiment, although the coupling factor may be lower or higher than these ranges, in other embodiments. As also described previously, the directional coupler transmission line 461 (or 461') and the section of the impedance inverter transmission line 474 to which the directional coupler transmission line 461 (or 461') is proximate each have an electrical length in a range of about lambda/8 to about lambda/4, although the lengths may be shorter or longer, as well.

The first end of the directional coupler transmission line 461 (or 461') can be analogized to an isolated port of a parallel-coupled directional coupler, and the second end of the directional coupler transmission line 461 (or 461') can be analogized to a coupled port of the parallel-coupled directional coupler. Further, the point along the section of the impedance inverter transmission line 474 to which the first end of the directional coupler transmission line 461 (or 461') is proximate can be analogized to an input port of the parallel-coupled directional coupler, whereas the point along the section of the impedance inverter transmission line 474 to which the second end of the directional coupler transmission line 461 (or 461') is proximate can be analogized to a direct port of the parallel-coupled directional coupler. As indicated above, the first end of directional coupler transmission line 461 (or 461') (e.g., isolated port) is electrically coupled to landing pad 468, which in turn may be coupled to an externally terminated resistor (e.g., a 50 ohm resistor 366 connected to a ground reference). In an alternate embodiment, all or a portion of the resistance provided by the externally terminated resistor may be implemented with a discrete or distributed resistor (not illustrated) connected to the substrate 410 (e.g., resistor 367). The second end of directional coupler transmission line 461 (or 461') (e.g., coupled port) is electrically coupled to landing pad 464 (e.g., directional coupler output terminal 364). Landing pad 464, in turn, may be connected through an external termination tuning circuit 462 (e.g., termination tuning circuit 362, FIG. 3, or termination tuning circuit 1000, FIG. 10) to a feedback path to a DPD module (e.g., through feedback path 262 to DPD block 216, FIG. 2). In an alternate embodiment, all or a portion of the external termination tuning circuit may be implemented with a termination tuning circuit formed from one or more components that are physically connected to the substrate 410 (e.g., internal termination tuning circuit 363), and electrically coupled between transmission line 461 (or 461') and terminal 464 or 468.

Referring again to FIG. 4 and moving back to the power splitter 420 in the input signal and splitter zone 401, the second RF signal (i.e., the peaking signal) produced at output terminal 426 of the power splitter 420 and conveyed to conductive contact 492 is amplified through a peaking amplifier path. The peaking amplifier path includes input circuit 427 within the input signal and splitter zone 401, and a peaking amplifier die 452 (e.g., die 352, FIG. 3) mounted within the second-die mounting zone 403. As mentioned above, the power splitter 420 may impart about a 90-degree phase shift between the RF signals provided at output terminals 424, 426. Accordingly, the phase of the peaking signal received at input terminal 453 of peaking die 452 is delayed by about 90 degrees with respect to the carrier signal received at input terminal 433 of carrier die 432.

The input circuit 427 is electrically connected between conductive contacts 492 and 494. Although the detail is not shown in FIG. 4, the input circuit 427 may include a plurality of discrete and/or integrated components (e.g., inductors and capacitors) configured to provide proper impedance matching between the second power splitter output 426 and the input to the peaking die 452.

Conductive contact 494 is electrically coupled (e.g., with wirebonds 466) to an RF input terminal 453 of the peaking amplifier die 452, in order to provide an RF peaking signal for amplification to the peaking amplifier die 452. The illustrated embodiment of peaking amplifier die 452 also embodies a two-stage amplifier. More specifically, the electrical components of peaking amplifier die 452 include an RF input terminal 453, an integrated input matching network 454, a driver transistor 455, an integrated interstage matching network 456, an output transistor 457, and an RF output terminal 458. The driver and output transistors 455, 457 are coupled in series between the input and output terminals 453, 458, in substantially the same manner as previously described with respect to transistors 435, 437. The driver transistor 455 is configured to apply a relatively low gain to the peaking signal, and the output transistor 457 is configured to apply a relatively high gain to the peaking signal after preliminary amplification by the driver transistor 455. In other embodiments, the peaking amplifier die 452 may embody a single stage amplifier, or the peaking amplifier die 452 may include more than two amplification stages. Again, each of the transistors 455, 457 may be a FET or a BJT.

The input terminal 453 of die 452 is electrically coupled to the gate terminal of transistor 455 through input matching network 454, and the drain terminal of transistor 455 is electrically coupled to the gate terminal of transistor 457 through inter-stage matching network 456. According to an embodiment, the drain terminal of transistor 457 is electrically coupled to output terminal 458. Accordingly, the signal path through the carrier amplifier die 452 is in a direction extending from the RF input terminal 453 toward the RF output terminal 458, which direction is indicated by arrow 450. As can be seen in FIG. 4, the signal paths through the peaking and carrier amplifier die 452, 432 extend in significantly different directions, and more particularly the signal paths are perpendicular in the embodiment of FIG. 4.

An amplified RF peaking signal is produced by the peaking amplifier die 452 at the RF output terminal 458. In an embodiment, the RF output terminal 458 is electrically coupled to impedance inverter line 474 with wirebond array 475, and RF output terminal 458 functions as a combining node 480 (e.g., combining node 380, FIG. 3) at which the amplified and delayed carrier amplifier signal is combined, in phase, with an amplified peaking amplifier signal.

In addition, an external bias circuit (not illustrated) may be connected to the output terminal 458 of the peaking amplifier die 452 through wirebonds 446, conductive pad 495, and landing pad 418. When integrated with a larger RF system, landing pad 418 may be connected to the external bias circuit, which may provide a DC bias voltage to the output terminal 458, and accordingly to the drain of transistor 457.

According to an embodiment, the peaking amplifier die 452 may be substantially structurally identical to the carrier amplifier die 432, meaning that the two dies 432, 452 include the same structural and electrical elements arranged and interconnected in the same manner. According to a further embodiment, the peaking amplifier die 452 and the carrier amplifier die 432 also are identical in size, characterizing the Doherty amplifier module 400 as a symmetric Doherty amplifier. In an alternate embodiment, the peaking amplifier die 452 and the carrier amplifier die 432 may have different sizes, characterizing the Doherty amplifier module 400 as an asymmetric Doherty amplifier. For example, the peaking amplifier die 452 may be larger than the carrier amplifier die 432 by a ratio (e.g., 1.6:1, 4:1, or some other ratio).

As mentioned above, through the wirebond array 475, the RF output terminal 458 is electrically coupled to impedance inverter line 474. Accordingly, the amplified carrier signal produced by the carrier amplifier die 432 is received at the RF output terminal 458 of the peaking amplifier die 452 through the series combination of wirebond array 473, impedance inverter line 474, and wirebond array 475. The amplified peaking signal produced by the peaking amplifier die 452 also is received at the RF output terminal 458, and the module 400 is configured so that the amplified carrier and peaking signals arrive and are combined at output terminal 458 (or combining node 480) substantially in phase with each other.

Module 400 includes an output impedance transformer, which is electrically coupled between the RF output terminal 458 (or combining node 480) and output terminal 419 of the module 400. According to an embodiment, the output impedance transformer includes an output microstrip transmission line 496 (or "output line") formed from a portion of a conductive layer (e.g., layer 515) and one or more discrete and/or distributed and/or integrated components 484 (e.g., capacitors and/or inductors) distributed along the output line 496 to provide a desired impedance matching. More specifically, the RF output terminal 458 (or combining node 480) is electrically coupled to conductive output line 496 at the mounting surface 412 with wirebond array 464, and the output impedance transformer functions to present the proper load impedance to combining node 480. For example, in FIG. 4, components 484 may include a plurality of shunt capacitors (i.e., capacitors each with one terminal electrically coupled to a point along output line 496, and the other terminal coupled to the ground reference). Each section of the output line 496 between each set of adjacent shunt capacitors corresponds to a series inductance of the output impedance transformer. Although FIG. 4 shows three shunt capacitors spaced along output line 496, in other embodiments, the output impedance transformer may include more or fewer shunt capacitors, more or fewer series inductances, and/or other components.

The output line 496 is electrically coupled, through decoupling capacitor 486 (if included), to conductive pad 497, which in turn is electrically coupled to conductive structures extending through the substrate 410 to conductive landing pad 419 (or the output terminal), which is exposed at the land surface 514. The landing pad 419 functions as the RF output node (e.g., RF output node 319, FIG. 3) for the module 400.

Figure 4:
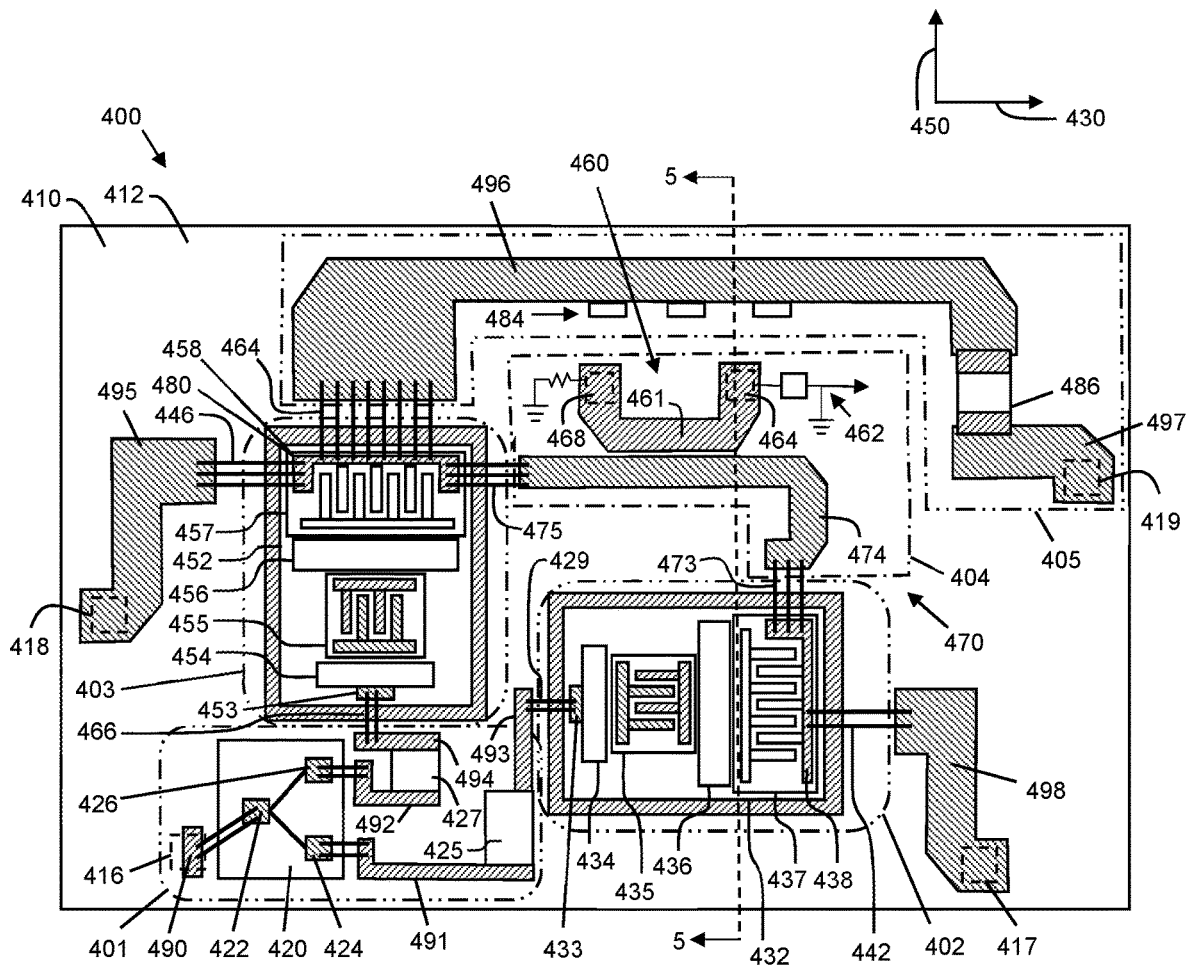
FIG. 4 is a top view of a Doherty amplifier module, in accordance with an example embodiment.

In the embodiments described in conjunction with FIGS. 4-6, a Doherty amplifier module 400 or 400' includes an integrated directional coupler 460 or 460' with a directional coupler transmission line 461 or 461' in proximity to a transmission line 474 associated with an impedance inverter assembly 470. In such embodiments, the directional coupler 460 or 460' is configured to generate a feedback signal (e.g., feedback signal, SF, FIG. 2) based on a forward signal traveling along impedance inverter transmission line 474. As discussed above in conjunction with the description of FIG. 3, in some alternate embodiments, a Doherty amplifier module (e.g., amplifier 300) may include an integrated directional coupler (e.g., directional coupler 360') that includes a directional coupler transmission line (e.g., transmission line 361') in proximity to an output microstrip transmission line (e.g., transmission line 396). In such embodiments, the directional coupler (e.g., directional coupler 360') is configured to generate a feedback signal (e.g., feedback signal, SF, FIG. 2) based on a forward signal traveling along the output microstrip transmission line (e.g., transmission line 396).

Embodiments of a physical implementation of the Doherty amplifier circuit of FIG. 3, which include embodiments of a directional coupler 360' proximate an output microstrip transmission line 396 now will be described in detail in conjunction with FIGS. 7-9. More specifically, FIG. 7 is a top view of a Doherty amplifier module 700, in accordance with various example embodiments. FIG. 7 should be viewed simultaneously with FIGS. 8 and 9, which are cross-sectional, side views of two embodiments of a portion of the module 700 of FIG. 7 along line 8-8. Where components in FIGS. 7-9 correspond to substantially similar or identical components, the same reference numbers are used. In addition, where components in FIGS. 7-9 correspond to substantially similar or identical components in the embodiments described in conjunction with FIGS. 4-6, the same reference numbers also are used. For the purposes of brevity, the details of such similar or identical components are not discussed in detail below. Such details are intended to be applied from the previous description of FIGS. 4-6 to the description of the embodiments of FIGS. 7-9, below.

Briefly, Doherty amplifier module 700 includes a substrate 710, a power splitter 420 (e.g., power splitter 320, FIG. 3), a carrier amplifier die 432 (e.g., carrier amplifier die 332, FIG. 3), a peaking amplifier die 452 (e.g., peaking amplifier die 352, FIG. 3), a phase shift and impedance inversion assembly 470 (e.g., phase shift and impedance inversion assembly 370, FIG. 3), a directional coupler 760 (FIG. 7, 8) or 760' (FIG. 9), and various other circuit elements, which will be discussed in more detail below.

The Doherty amplifier module 700 may be implemented as an LGA module, for example, in which conductive landing pads 416, 417, 418, 419, 764, 768 of the LGA are exposed at the land surface 514. Again, although module 700 is depicted as an LGA module, module 700 alternatively may be packaged as a pin grid array module, a QFN module, or another type of package. Either way, the component mounting surface 412 and the components mounted to that surface 412 optionally may be covered with an encapsulant material (e.g., encapsulant material 530, FIGS. 8, 9, such as a plastic encapsulant). In an alternate embodiment, the components could be contained within an air cavity, which is defined by various structures (not illustrated) overlying the mounting surface 412.

Substrate 710 may be a multi-layer organic substrate (e.g., formed from PCB materials), which includes a plurality of metal layers 508, 509, 510, 511, 512, 513, 514, 515 that are separated by (or interleaved with) a plurality dielectric material layers 518, 519, 520, 521, 522, 523, 524. Conductive vias (e.g., via 517), which extend through the dielectric material layers 518-524, provide for electrical connectivity between the metal layers 508-515. According to an embodiment, the lowest internal metal layer 508 (i.e., the internal metal layer closest to bottom surface 514) is utilized to provide the conductive landing pads 416-419, 764, 768 of the LGA.

A patterned metal layer 515 on the mounting surface 412 of the substrate 710 may include a plurality of conductive contacts, microstrip lines, and traces (e.g., elements 490-494, 474, 495-498, 761), which facilitates electrical connection to die and other components that are coupled to the mounting surface 412. Although substrate 710 is depicted to include seven internal metal layers 508-514, and seven dielectric material layers 518-524, substrates that include more or fewer metal layers and/or more or fewer dielectric material layers alternatively may be used.

As described previously in conjunction with the embodiments of FIGS. 4-6, module 700 includes an output impedance transformer, which includes an output microstrip transmission line 496 (or "output line") formed from a portion of a conductive layer (e.g., layer 515) and one or more discrete and/or distributed and/or integrated components 484 (e.g., capacitors and/or inductors) distributed along the output line 496 to provide a desired impedance matching. More specifically, the output impedance transformer functions to present the proper load impedance to combining node 480. For example, in FIG. 7, components 484 may include a plurality of shunt capacitors 484-1, 484-2, 484-3 (i.e., capacitors each with one terminal electrically coupled to a point along output line 496, and the other terminal coupled to the ground reference). Each section of the output line 496 between each set of adjacent shunt capacitors 484-1, 484-2, 484-3 corresponds to a series inductance of the output impedance transformer. For example, a first section of the output line 496 coupled between shunt capacitors 484-1 and 484-2 corresponds to a first series inductance with a first terminal coupled to shunt capacitor 484-1, and a second terminal coupled to capacitor 484-2. Similarly, a second section of the output line 496 coupled between shunt capacitors 484-2 and 484-3 corresponds to a second series inductance with a first terminal coupled to shunt capacitor 484-2, and a second terminal coupled to capacitor 484-3. The section of output line 496 between wirebonds 464 and the first shunt capacitor 484-1 corresponds to a third series inductance, and the section of the output line 496 between the third shunt capacitor 494-3 and bypass capacitor 496 corresponds to a fourth series inductance. In other embodiments, the output impedance transformer may include more or fewer shunt capacitors, more or fewer series inductances, and/or other components.

The output line 496 is electrically coupled, through decoupling capacitor 486 (if included), to conductive pad 497, which in turn is electrically coupled to conductive structures extending through the substrate 710 to conductive landing pad 419 (or the output terminal), which is exposed at the land surface 514. The landing pad 419 functions as the RF output node (e.g., RF output node 319, FIG. 3) for the module 700.

In contrast with the embodiments described in conjunction with FIGS. 4-6, module 700 does not include a directional coupler in proximity to the impedance inverter line assembly 470. Instead, in the embodiments of FIGS. 7-9, module 700 includes a directional coupler 760 (FIG. 7, 8) or 760' (FIG. 9) (e.g., directional coupler 360', FIG. 3) implemented on the substrate 710 in proximity to the output impedance transformer, and more particularly in proximity to the output microstrip transmission line 496 (or the output transformer) that provides electrical connectivity between the combining node 480 and the output terminal 419 of the module 700.

Figure 8:
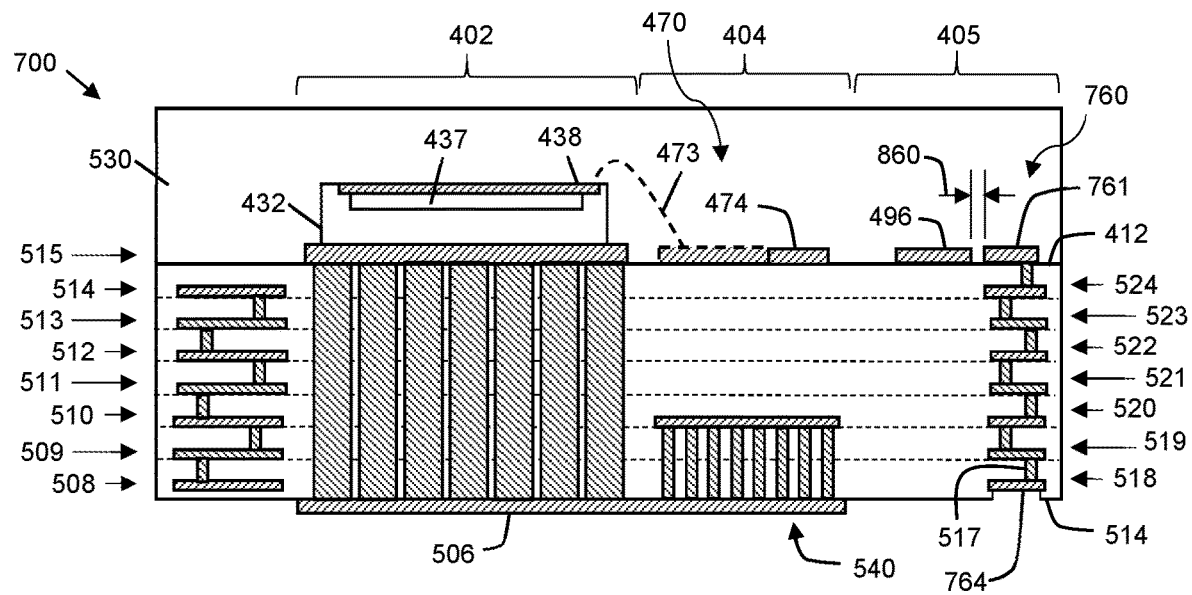
FIG. 8 is a cross-sectional, side view of the module of FIG. 7 along line 8-8, in accordance with an example embodiment.

According to one embodiment, as illustrated in FIG. 8, the directional coupler 760 includes a section of the output microstrip transmission line 496 (or main line), a transmission line 761 (or coupled line) formed from a portion of conductive layer 515 on the mounting surface 412 of the module 700, a first series of electrically connected conductive structures (e.g., conductive vias and traces) that electrically connect a first end of the transmission line 761 to a first conductive landing pad 768 (e.g., terminal 368') exposed at the land surface 514, and a second series of electrically connected conductive structures (e.g., conductive vias and traces) that electrically connect a second end of the transmission line 761 to a second conductive landing pad 764 (e.g., terminal 364') exposed at the land surface 514.

In the embodiment shown in FIG. 8, transmission lines 761, 496 are formed from portions of a same conductive layer (e.g., layer 515), and accordingly transmission lines 761, 496 are co-planar (i.e., with the plane being defined by mounting surface 412) with sides of the transmission lines 761, 496 extending in parallel with each other along the length of transmission line 761. Transmission line 761 is arranged in parallel with, but electrically isolated from, a section of the output transmission line 496. A gap having width 860 is present between transmission lines 761, 496 (along the length of transmission line 761), which ensures electrical isolation between the transmission lines 761, 496. However, the gap width 860 is small enough to ensure sufficient electromagnetic communication between the transmission lines 761, 496 so as to produce, during operation of module 700, a low-power replica along transmission line 761 of the forward RF signal conveyed through transmission line 496. This low-power replica signal is, in turn, produced at landing pad 764 during operation. In the embodiment of FIG. 8, the gap between transmission lines 761, 496 is an air gap, or a gap that is filled with the material of encapsulant 530 (when included).

Figure 9:
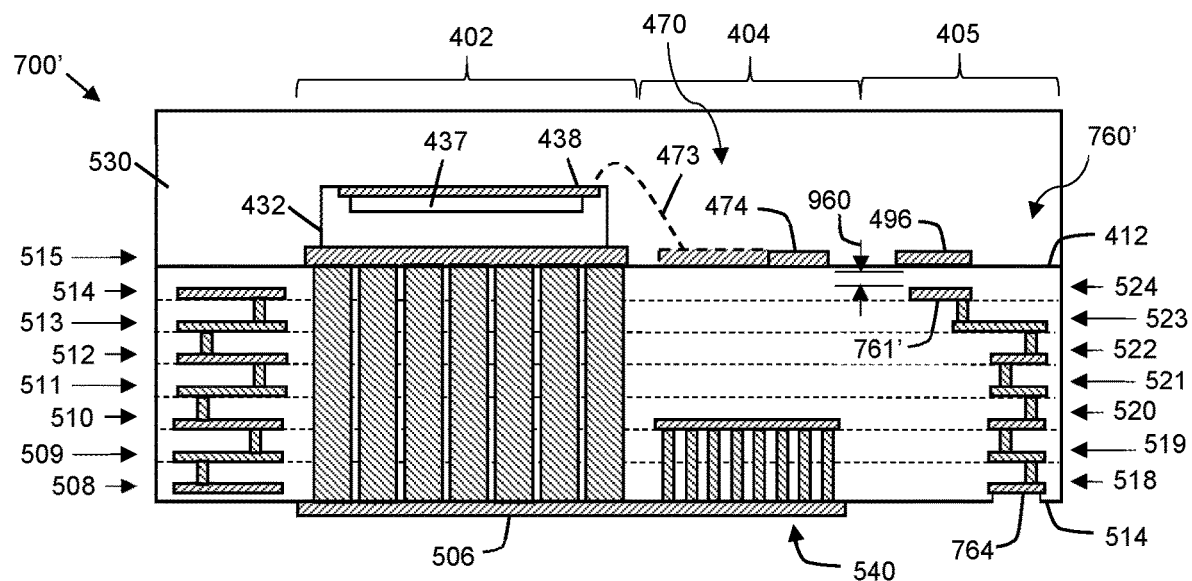
FIG. 9 is a cross-sectional, side view of the module of FIG. 7 along line 8-8, in accordance with another example embodiment.

According to another embodiment, as illustrated in FIG. 9, the directional coupler 760' includes a section of the microstrip transmission line 496 (or main line), a transmission line 761' (or coupled line) formed from a portion of an internal conductive layer (e.g., layer 514) that is below the mounting surface 412 of the module 700', a first series of electrically connected conductive structures (e.g., conductive vias and traces) that electrically connect a first end of the transmission line 761' to a first conductive landing pad 768 (e.g., terminal 368') exposed at the land surface 514, and a second series of electrically connected conductive structures (e.g., conductive vias and traces) that electrically connect a second end of the transmission line 761' to a second conductive landing pad 764 (e.g., terminal 364') exposed at the land surface 514.

In the embodiment shown in FIG. 9, transmission lines 761', 496 are formed from portions of different conductive layers (e.g., layers 514, 515), where those portions of the different conductive layers are non-co-planar, but vertically aligned with each other (i.e., overlapping in the vertical dimension from the perspective of FIG. 9). In other words, the top and bottom surfaces, respectively, of transmission lines 761', 496 extend in parallel with each other along the length of transmission line 761', which length may be approximately equal to the length of transmission line 761 depicted in FIG. 7. Again, transmission line 761' is arranged in parallel with, but electrically isolated from, a section of the output transmission line 496. A gap having width 960 is present between transmission lines 761', 496 (along the length of transmission line 761'), which ensures electrical isolation between the transmission lines 761', 496. However, the gap width 960 is small enough to ensure sufficient electromagnetic communication between the transmission lines 761', 496 so as to produce, during operation of module 700', a low-power replica along transmission line 761' of the forward RF signal conveyed through transmission line 496. This low-power replica signal is, in turn, produced at landing pad 764 during operation. In the embodiment of FIG. 9, the gap between transmission lines 761', 496 is filled with dielectric material of dielectric material layer 524. In other embodiments, transmission line 761' may be formed from a portion of another lower conductive layer (e.g., one of layers 509-513), in which case the gap would be filled with dielectric material of multiple dielectric layers (e.g., a set of consecutive layers 519-523).

In either embodiment, the gap width 860, 960 is selected based on a desired coupling factor. For example, with respect to the embodiment of FIG. 8, the gap width 860 may be in a range of about 1 mil to about 10 mil, in an embodiment, or in a range of about 3 mil to about 5 mil, in another embodiment, although the gap width 860 may be smaller or larger, as well. With respect to the embodiment of FIG. 9, the gap width 960 will be a factor of the thickness of the dielectric layer(s) between the transmission lines 761', 496. For example, the gap width 960 may be in a range of about 0.5 mil to about 20 mil, in an embodiment, or in a range of about 5 mil to about 10 mil, in another embodiment, although the gap width 960 may be smaller or larger, as well. As described previously, the transmission lines 761 (or 761'), 496 are arranged to have a coupling factor between them of about 10 dB to about 40 dB, in an embodiment, or between about 20 dB and about 30 dB, in another embodiment, although the coupling factor may be lower or higher than these ranges, in other embodiments. As also described previously, the directional coupler transmission line 761 (or 761') and the section of the output transmission line 496 to which the directional coupler transmission line 761 (or 761') is proximate each have an electrical length in a range of about lambda/8 to about lambda/4, although the lengths may be shorter or longer, as well.

The first end of the directional coupler transmission line 761 (or 761') can be analogized to an isolated port of a parallel-coupled directional coupler, and the second end of the directional coupler transmission line 761 (or 761') can be analogized to a coupled port of the parallel-coupled directional coupler. Further, the point along the section of the output transmission line 496 to which the first end of the directional coupler transmission line 761 (or 761') is proximate can be analogized to an input port of the parallel-coupled directional coupler, whereas the point along the section of the output transmission line 496 to which the second end of the directional coupler transmission line 761 (or 761') is proximate can be analogized to a direct port of the parallel-coupled directional coupler. As indicated above, the first end of directional coupler transmission line 761 (or 761') (e.g., isolated port) is electrically coupled to landing pad 768, which in turn may be coupled to an externally terminated resistor (e.g., a 50 ohm resistor 366' connected to a ground reference). In an alternate embodiment, all or a portion of the resistance provided by the externally terminated resistor may be implemented with a discrete or distributed resistor (not illustrated) connected to the substrate 710 (e.g., resistor 367'). The second end of directional coupler transmission line 761 (or 761') (e.g., coupled port) is electrically coupled to landing pad 764 (e.g., directional coupler output terminal 364'). Landing pad 764, in turn, may be connected through an external termination tuning circuit 762 (e.g., termination tuning circuit 362', FIG. 3, or termination tuning circuit 1000, FIG. 10) to a feedback path to a DPD module (e.g., through feedback path 262 to DPD block 216, FIG. 2). In an alternate embodiment, all or a portion of the external termination tuning circuit may be implemented with a termination tuning circuit formed from one or more components that are physically connected to the substrate 710 (e.g., internal termination tuning circuit 363'), and electrically coupled between transmission line 761 (or 761') and terminal 764 or 768.

The above described embodiments include two-way Doherty power amplifier implementations, which include a carrier amplifier and one peaking amplifier. According to other embodiments, a Doherty power amplifier may include more than one peaking amplifier (e.g., Doherty amplifiers with a carrier amplifier path and two or more peaking amplifier paths). Further, although the above description pertains to non-inverted Doherty amplifier configurations, the various embodiments also could apply to inverted Doherty amplifier configurations. Further still, a module may be modified to implement types of amplifiers other than Doherty amplifiers. Said another way, modules configured to include directional couplers may be utilized in amplifier configurations other than those illustrated and discussed herein.

Various modifications may be made to amplifier 300 and/or modules 400, 400', 700, 700' without departing from the scope of the inventive subject matter. For example, although substrates 400, 400', 700, 700' are depicted in FIGS. 5, 6, 8, and 9 to include seven metal layers, substrates that include more or fewer metal layers alternatively may be used. In addition, other types of substrates alternatively could be used, including ceramic substrates or other types of substrates. Further, each of the carrier and peaking amplifier die may include single stage amplifiers, or two distinct amplifier die (one driver amplifier die and one final stage amplifier die) may be implemented along each amplification path.

As described above, in various embodiments, a termination tuning circuit (e.g., termination tuning circuit 362, 362', 363, 363', 462, 762) may be electrically coupled to a coupled line of a directional coupler (e.g., transmission line 361, 361', 461, 461', 761, 761'). The termination tuning circuit may be implemented with components that are external to a Doherty amplifier module and/or that are internal to (i.e., physically coupled to) a Doherty amplifier module, in various embodiments. Whether implemented externally and/or internally, the termination tuning circuit functions to improve the directivity of the directional coupler by compensating for the reactance associated with a termination resistor (e.g., resistor 366, 367, 366', 367') at high frequencies. For example, the termination tuning circuit may be configured as a low pass filter, a bandpass filter, or a combination of a high pass and low pass filter, in various embodiments.

Figure 10:
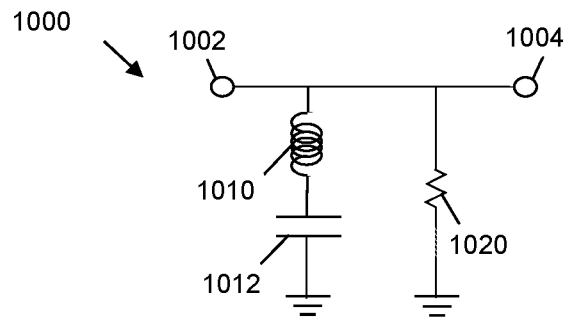
FIG. 10 is a simplified schematic diagram of a termination tuning circuit for use with a directional coupler, in accordance with an example embodiment.

By way of non-limiting example, FIG. 10 is a simplified schematic diagram of a termination tuning circuit 1000 (e.g., termination tuning circuit 362, 362', 363, 363', 462, 762) for use with a directional coupler, in accordance with an example embodiment. Circuit 1000 includes an input node 1002, an output node 1004, a first shunt circuit including a series combination of inductor 1010 and capacitor 1012, and a second shunt circuit including resistor 1020.

When incorporated into an amplifier system such as those described above, the input node 1002 is electrically coupled to the coupled line of a directional coupler (e.g., transmission line 361, 361', 461, 461', 761, 761'), and a coupled signal conveyed by the coupled line to the input node 1002 is filtered by the termination circuit 1000 and output at the output node 1004. In some embodiments, the input and output nodes 1002, 1004 are connected along a signal path between the coupled line of the directional coupler and a feedback path to a subsystem configured to analyze the signal carried along the coupled line and filtered by the termination tuning circuit 1000 (e.g., feedback path 262 to DPD 216, FIG. 2). In other embodiments, the input and output nodes 1002, 1004 are connected along a signal path between the coupled line of the directional coupler and a termination resistor (e.g., resistor 366, 367, 366', 367'), or between the termination resistor and a ground reference.

The first and second shunt circuits of the termination tuning circuit 1000 each are coupled between the conductive signal path between input and output nodes 1002, 1004 and a ground reference. The inductance, capacitance, and resistance values of inductor 1010, capacitor 1012, and resistor 1020, respectively, are selected to compensate for the reactance of the termination resistor at high frequencies (e.g., within a frequency band of operation of the amplifier). In various embodiments, the inductor 1010, capacitor 1012, and resistor 1020 may be implemented using discrete (e.g., surface mount) components, integrated passive devices, and/or distributed components that are either physically connected to an amplifier module substrate that also includes the coupled line, or that are physically connected to an external substrate (e.g., a PCB) to which the amplifier module is connected. Although a termination tuning circuit 1000 with a particular configuration of passive components is shown in FIG. 10, those of skill in the art would understand, based on the description herein, that differently configured circuits may provide the desired reactance compensation, in other embodiments. For example, alternate embodiments of a termination tuning circuit may include a pi network or a differently configured low pass, band pass, and/or combined low pass and high pass circuit.

Figure 11:
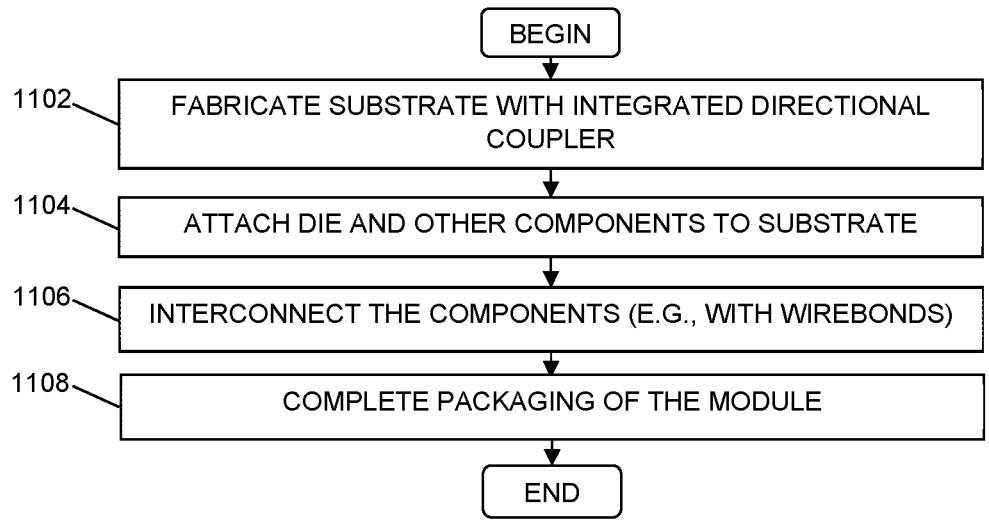
FIG. 11 is a flowchart of a method for fabricating an amplifier module, in accordance with an example embodiment.

FIG. 11 is a flowchart of a method for fabricating a Doherty amplifier module (e.g., Doherty amplifier module 400, 400', 700, 700', FIGS. 4-9), in accordance with various example embodiments. The method begins, in block 1102, by fabricating a substrate (e.g., substrate 410, 710, FIGS. 4-9) that includes an integrated directional coupler (e.g., directional coupler 460, 460', 760, 760'). As described previously, the integrated directional coupler may include a coupled transmission line (e.g., transmission line 461, 461', 761, 761') in proximity to an impedance inverter line (e.g., impedance inverter line 474, FIGS. 4-6) or an output line (e.g., output line 496, FIGS. 7-9), in various embodiments. Further, the coupled transmission line may be formed from a same metal layer and/or co-planar with the impedance inverter line or the output line, in some embodiments (e.g., as in embodiments illustrated in FIGS. 5 and 8), or the coupled transmission line may be formed from a different metal layer and/or non-co-planar with the impedance inverter line or the output line, in other embodiments (e.g., as in embodiments illustrated in FIGS. 6 and 9).

In addition to the integrated directional coupler, the substrate also includes a plurality of conductive features (e.g., landing pads, contacts, conductive traces, and conductive vias) arranged to provide desired electrical connectivity to subsequently attached discrete die and components. As discussed previously, a plurality of non-overlapping zones (e.g., zones 401-405, FIGS. 4, 7) may be defined at the mounting surface (e.g., surface 412, FIGS. 4, 7) of the substrate. Within die mounting zones (e.g., zones 402, 403, FIGS. 4, 7), the substrate may include conductive heat-sink features (e.g., conductive trenches 580, FIGS. 5, 6, 8, 9). In addition, in an embodiment, the substrate may include one or more microstrip transmission line elements (e.g., microstrip transmission lines 474, 496, FIGS. 4-9), with physical and electrical lengths configured as described in detail above. Further still, the substrate may include a ground plane height variation structure (e.g., structure 540, FIGS. 5, 6, 8, 9) configured to elevate the ground plane below certain transmission lines (e.g., transmission line 474, FIGS. 4-9).

In block 1004, first and second amplifier die (e.g., carrier and peaking amplifier die 432, 452, FIGS. 4-9) are attached to the mounting surface of the substrate in the die mounting zones. As discussed previously, the first and second amplifier die may be attached so that RF signal paths through the die are oriented in substantially different directions (or angularly separated). For example, the first and second amplifier die may be attached to the substrate so that the die, and the RF signal paths through the die, are substantially perpendicular to each other. A power splitter (e.g., power splitter 420, FIGS. 4, 7) and other discrete components (e.g., decoupling capacitor 486, a termination resistor for the directional coupler, and/or components associated with a termination tuning circuit) also may be attached to the mounting surface of the substrate.

In block 1006, the various dies, microstrip lines, and components are electrically connected together with additional connectors (e.g., including wirebonds) and/or other conductive coupling means. Finally, in block 1008, the various die and components overlying the mounting surface of the substrate are encapsulated (e.g., with encapsulant material 530, FIGS. 5, 6, 8, 9), or otherwise contained (e.g., in an air cavity package configuration) to complete packaging of the module.

An embodiment of an amplifier includes a first amplifier (e.g., first power transistor die) with a first output terminal, a second amplifier (e.g., second power transistor die) with a second output terminal, and a plurality of microstrip transmission lines electrically connected to the first and second amplifiers. The microstrip transmission lines include an impedance inverter line electrically connected between the first and second output terminals, and an output line electrically connected between the second output terminal and an output of the amplifier, where the output line forms a portion of an output impedance transformer. The amplifier also includes a directional coupler formed from a main line and a coupled line positioned in proximity to the main line, where the main line is formed from a portion of one of the microstrip transmission lines. The amplifier may also include a module substrate with a plurality of metal layers, where the main line and the coupled line are formed from different portions of the metal layers. The amplifier may be a Doherty amplifier, where the first amplifier is a carrier amplifier, and the second amplifier is a peaking amplifier.

Another embodiment of an amplifier includes a first amplifier (e.g., first power transistor die) with a first output terminal, a second amplifier (e.g., second power transistor die) with a second output terminal, an impedance inverter line electrically connected between the first and second output terminals, and a directional coupler formed from a portion of the impedance inverter line and a coupled line that is positioned in proximity to the portion of the impedance inverter line. The amplifier may also include a module substrate with a plurality of metal layers, where the impedance inverter line and the coupled line are formed from different portions of the metal layers. The amplifier may be a Doherty amplifier, where the first amplifier is a carrier amplifier, and the second amplifier is a peaking amplifier.

Yet another embodiment of an amplifier includes a first amplifier (e.g., first power transistor die) with a first output terminal, an output impedance transformer including an output line electrically connected between the first output terminal and an output of the amplifier, and a directional coupler formed from a portion of the output line and a coupled line that is positioned in proximity to the portion of the output line. The amplifier also may include a second amplifier (e.g., second power transistor die) with a second output terminal, and an impedance inverter line electrically connected between the first and second output terminals. The amplifier may be a Doherty amplifier, where the first amplifier is a peaking amplifier, and the second amplifier is a carrier amplifier. The amplifier may also include a module substrate with a plurality of metal layers, where the output line and the coupled line are formed from different portions of the metal layers.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier comprising:
 a first amplifier with a first output terminal;
 a second amplifier with a second output terminal;
 a plurality of microstrip transmission lines electrically connected to the first and second amplifiers, wherein the plurality of microstrip transmission lines include
 an impedance inverter line electrically connected between the first and second output terminals, and
 an output line electrically connected between the second output terminal and an output of the amplifier, wherein the output line forms a portion of an output impedance transformer; and
 a directional coupler formed from a main line and a coupled line that is positioned in proximity to the main line, wherein the main line is formed from a portion of one of the plurality of microstrip transmission lines, and the coupled line is electrically isolated from the main line.

2. The amplifier of claim 1, wherein the amplifier is a Doherty amplifier, the first amplifier is a carrier amplifier, and the second amplifier is a peaking amplifier.

3. The amplifier of claim 1, wherein the main line and the coupled line are arranged to have a coupling factor between 10 decibels and 40 decibels.

4. The amplifier of claim 1, further comprising:
 a module substrate that includes a plurality of metal layers, wherein the main line and the coupled line are formed from different portions of the plurality of metal layers.

5. An amplifier comprising:
 a first amplifier with a first output terminal;
 a second amplifier with a second output terminal;
 a plurality of microstrip transmission lines electrically connected to the first and second amplifiers, wherein the plurality of microstrip transmission lines include
 an impedance inverter line electrically connected between the first and second output terminals, and
 an output line electrically connected between the second output terminal and an output of the amplifier, wherein the output line forms a portion of an output impedance transformer;
 a directional coupler formed from a main line and a coupled line that is positioned in proximity to the main line, wherein the main line is formed from a portion of one of the plurality of microstrip transmission lines;
 a module substrate that includes a plurality of metal layers, wherein the main line and the coupled line are formed from different portions of the plurality of metal layers;
 a first conductive landing pad exposed at a surface of the module substrate;
 a first conductive structure that extends through the module substrate to electrically connect a first end of the coupled line to the first conductive landing pad;
 a second conductive landing pad exposed at the surface of the module substrate; and
 a second conductive structure that extends through the module substrate to electrically connect a second end of the coupled line to the second conductive landing pad.

6. An amplifier comprising:
 a first amplifier with a first output terminal;
 a second amplifier with a second output terminal;
 a plurality of microstrip transmission lines electrically connected to the first and second amplifiers, wherein the plurality of microstrip transmission lines include an impedance inverter line electrically connected between the first and second output terminals, and
an output line electrically connected between the second output terminal and an output of the amplifier, wherein the output line forms a portion of an output impedance transformer;
a directional coupler formed from a main line and a coupled line that is positioned in proximity to the main line, wherein the main line is formed from a portion of one of the plurality of microstrip transmission lines;
a module substrate that includes a plurality of metal layers, wherein the main line and the coupled line are formed from different portions of the plurality of metal layers; and
a termination tuning circuit electrically coupled to the coupled line, wherein the termination tuning circuit is configured to compensate for a reactance associated with a termination resistor that also is electrically coupled to the coupled line.

7. The amplifier of claim 6, wherein the termination tuning circuit comprises one or more components that are physically connected to the module substrate.

8. An amplifier comprising:
a first amplifier with a first output terminal;
a second amplifier with a second output terminal;
an impedance inverter line electrically connected between the first and second output terminals;
a directional coupler formed from a portion of the impedance inverter line and a coupled line that is positioned in proximity to the portion of the impedance inverter line, wherein the coupled line is electrically isolated from the impedance inverter line; and
a termination tuning circuit electrically coupled to the coupled line, wherein the termination tuning circuit is configured to compensate for a reactance associated with a termination resistor that also is electrically coupled to the coupled line.

9. The amplifier of claim 8, wherein the amplifier is a Doherty amplifier, the first amplifier is a carrier amplifier, and the second amplifier is a peaking amplifier.

10. The amplifier of claim 8, wherein the impedance inverter line and the coupled line are arranged to have a coupling factor between 10 decibels and 40 decibels.

11. The amplifier of claim 8, further comprising:
a module substrate that includes a plurality of metal layers, wherein the impedance inverter line and the coupled line are formed from different portions of the plurality of metal layers.

12. An amplifier comprising:
a first amplifier with a first output terminal;
a second amplifier with a second output terminal;
an impedance inverter line electrically connected between the first and second output terminals;
a directional coupler formed from a portion of the impedance inverter line and a coupled line that is positioned in proximity to the portion of the impedance inverter line, wherein the coupled line is electrically isolated from the impedance inverter line; and
a module substrate that includes a plurality of metal layers, wherein the impedance inverter line and the coupled line are formed from different portions of the plurality of metal layers,
wherein the impedance inverter line and the coupled line are formed from portions of a same metal layer of the plurality of metal layers, and a gap is present between the impedance inverter line and the coupled line.

13. An amplifier comprising:
a first amplifier with a first output terminal;
a second amplifier with a second output terminal;
an impedance inverter line electrically connected between the first and second output terminals;
a directional coupler formed from a portion of the impedance inverter line and a coupled line that is positioned in proximity to the portion of the impedance inverter line, wherein the coupled line is electrically isolated from the impedance inverter line; and
a module substrate that includes a plurality of metal layers, wherein the impedance inverter line and the coupled line are formed from different portions of the plurality of metal layers,
wherein the impedance inverter line is formed from a portion of a first metal layer of the plurality of metal layers, and the coupled line is formed from a portion of a different second metal layer of the plurality of metal layers, and one or more dielectric material layers are present between the impedance inverter line and the coupled line.

14. An amplifier comprising:
a first amplifier with a first output terminal;
a second amplifier with a second output terminal;
an impedance inverter line electrically connected between the first and second output terminals;
a directional coupler formed from a portion of the impedance inverter line and a coupled line that is positioned in proximity to the portion of the impedance inverter line, wherein the coupled line is electrically isolated from the impedance inverter line;
a module substrate that includes a plurality of metal layers, wherein the impedance inverter line and the coupled line are formed from different portions of the plurality of metal layers;
a first conductive landing pad exposed at a surface of the module substrate;
a first conductive structure that extends through the module substrate to electrically connect a first end of the coupled line to the first conductive landing pad;
a second conductive landing pad exposed at the surface of the module substrate; and
a second conductive structure that extends through the module substrate to electrically connect a second end of the coupled line to the second conductive landing pad.

15. The amplifier of claim 8, wherein the impedance inverter line includes a first microstrip transmission line, and the coupled line includes a second microstrip transmission line.

16. An amplifier comprising:
a first amplifier with a first output terminal;
an output impedance transformer including an output line electrically connected between the first output terminal and an output of the amplifier;
a directional coupler formed from a portion of the output line and a coupled line that is positioned in proximity to the portion of the output line, wherein the coupled line is electrically isolated from the output line; and
a termination tuning circuit electrically coupled to the coupled line, wherein the termination tuning circuit is configured to compensate for a reactance associated with a termination resistor that also is electrically coupled to the coupled line.

17. The amplifier of claim 16, further comprising:
a second amplifier with a second output terminal; and
an impedance inverter line electrically connected between the first and second output terminals, and wherein the amplifier is a Doherty amplifier, the first amplifier is a peaking amplifier, and the second amplifier is a carrier amplifier.

18. The amplifier of claim 16, wherein the output line and the coupled line are arranged to have a coupling factor between them of 10 decibels to 40 decibels.

19. The amplifier of claim 16, further comprising:
a module substrate that includes a plurality of metal layers, wherein the output line and the coupled line are formed from different portions of the plurality of metal layers.

20. An amplifier comprising:
a first amplifier with a first output terminal;
an output impedance transformer including an output line electrically connected between the first output terminal and an output of the amplifier;
a directional coupler formed from a portion of the output line and a coupled line that is positioned in proximity to the portion of the output line, wherein the coupled line is electrically isolated from the output line; and
a module substrate that includes a plurality of metal layers, wherein the output line and the coupled line are formed from different portions of the plurality of metal layers, and
wherein the output line and the coupled line are formed from portions of a same metal layer of the plurality of metal layers, and a gap is present between the output line and the coupled line.

21. An amplifier comprising:
a first amplifier with a first output terminal;
an output impedance transformer including an output line electrically connected between the first output terminal and an output of the amplifier;
a directional coupler formed from a portion of the output line and a coupled line that is positioned in proximity to the portion of the output line, wherein the coupled line is electrically isolated from the output line; and
a module substrate that includes a plurality of metal layers, wherein the output line and the coupled line are formed from different portions of the plurality of metal layers, and
wherein the output line is formed from a portion of a first metal layer of the plurality of metal layers, and the coupled line is formed from a portion of a different second metal layer of the plurality of metal layers, and one or more dielectric material layers are present between the output line and the coupled line.

22. An amplifier comprising:
a first amplifier with a first output terminal;
an output impedance transformer including an output line electrically connected between the first output terminal and an output of the amplifier;
a directional coupler formed from a portion of the output line and a coupled line that is positioned in proximity to the portion of the output line, wherein the coupled line is electrically isolated from the output line;
a module substrate that includes a plurality of metal layers, wherein the output line and the coupled line are formed from different portions of the plurality of metal layers;
a first conductive landing pad exposed at a surface of the module substrate;
a first conductive structure that extends through the module substrate to electrically connect a first end of the coupled line to the first conductive landing pad;
a second conductive landing pad exposed at the surface of the module substrate; and
a second conductive structure that extends through the module substrate to electrically connect a second end of the coupled line to the second conductive landing pad.

23. The amplifier of claim 16, wherein the output line includes a first microstrip transmission line, and the coupled line includes a second microstrip transmission line.

* * * * *